(12) United States Patent
Meier et al.

(10) Patent No.: US 12,476,155 B2
(45) Date of Patent: Nov. 18, 2025

(54) O-RING SEALS FOR FLUID SENSING

(71) Applicant: TEXAS INSTRUMENTS INCORPORATED, Dallas, TX (US)

(72) Inventors: Sebastian Meier, Munich (DE); Bernhard Peter Lange, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/530,193

(22) Filed: Dec. 5, 2023

(65) Prior Publication Data

US 2024/0128137 A1 Apr. 18, 2024

Related U.S. Application Data

(63) Continuation of application No. 16/932,128, filed on Jul. 17, 2020, now Pat. No. 11,837,513.

(Continued)

(51) Int. Cl.
*H01L 23/10* (2006.01)
*G01N 27/28* (2006.01)
(Continued)

(52) U.S. Cl.
CPC ............ *H01L 23/10* (2013.01); *G01N 27/28* (2013.01); *G01N 27/4167* (2013.01); *H01L 21/56* (2013.01); *H01L 23/053* (2013.01); *H01L 23/16* (2013.01); *H01L 24/48* (2013.01); *H01L 2224/48225* (2013.01)

(58) Field of Classification Search
None
See application file for complete search history.

(56) References Cited

U.S. PATENT DOCUMENTS 4,838,089 A * 6/1989 Okada .................... G01L 19/14
73/114.37
6,401,545 B1 * 6/2002 Monk ................. G01L 19/0627
73/756

(Continued)

FOREIGN PATENT DOCUMENTS

KR 100652571 B1 * 12/2006 ............. H01L 23/58

OTHER PUBLICATIONS

Johnson et al., "Deep-Sea DuraFET: A Pressure Tolerant pH Sensor Designed for Global Sensor Networks," Analytical Chemistry, Feb. 18, 2016, 8 p.

(Continued)

*Primary Examiner* — Nishath Yasmeen
(74) *Attorney, Agent, or Firm* — Dawn Jos; Frank D. Cimino

(57) ABSTRACT

In some examples, a device comprises a substrate including a notch formed in a surface of the substrate and a semiconductor die positioned in the notch and including an electrochemical sensor on an active surface of the semiconductor die. The device also comprises a chemically inert member abutting the surface of the substrate and including an orifice in vertical alignment with the electrochemical sensor as a result of the semiconductor die being positioned in the notch. The device also comprises a compressed o-ring seal positioned between the chemically inert member and the active surface of the semiconductor die, the compressed o-ring seal circumscribing the electrochemical sensor.

14 Claims, 35 Drawing Sheets

Related U.S. Application Data

(60) Provisional application No. 62/875,369, filed on Jul. 17, 2019.

(51) Int. Cl.
| | |
|---|---|
| *G01N 27/416* | (2006.01) |
| *H01L 21/56* | (2006.01) |
| *H01L 23/00* | (2006.01) |
| *H01L 23/053* | (2006.01) |
| *H01L 23/16* | (2006.01) |

(56) References Cited

U.S. PATENT DOCUMENTS

| | | | | |
|---|---|---|---|---|
| 6,453,749 | B1* | 9/2002 | Petrovic | G01L 19/0069 |
| | | | | 73/754 |
| 6,769,319 | B2* | 8/2004 | McDonald | G01L 19/141 |
| | | | | 73/431 |
| 6,885,107 | B2 | 4/2005 | Kinsman | |
| 7,331,238 | B2* | 2/2008 | Wanami | B60R 21/0136 |
| | | | | 73/714 |
| 10,634,634 | B2* | 4/2020 | Ahn | H05K 3/462 |
| 2002/0078744 | A1* | 6/2002 | Gehman | G01F 1/6845 |
| | | | | 73/204.11 |
| 2009/0261691 | A1* | 10/2009 | Maeda | B81B 7/0048 |
| | | | | 310/348 |
| 2010/0212433 | A1* | 8/2010 | Hunziker | G01F 1/684 |
| | | | | 73/706 |
| 2010/0295139 | A1* | 11/2010 | Ly | B81B 7/0061 |
| | | | | 257/E23.002 |
| 2020/0045476 | A1* | 2/2020 | Wang | B81B 7/0061 |

OTHER PUBLICATIONS

Oelßner et al., "Encapsulation of ISFET Sensor Chips," © 2015 Interdisciplinary Centre for Mathematical and Computational Modelling, 2 p.

Datta-Chaudhuri et al., "Packaging Commercial CMOS Chips For Lab On A Chip Integration," PubMed, May 21, 2014, 1 p.

Grisel et al., "Packaging Technologies For Integrated Electrochemical Sensors," Sensor and Actuators, vol. 17, Issues 1-2, May 3, 1989, pp. 285-295, 2 p.

* cited by examiner

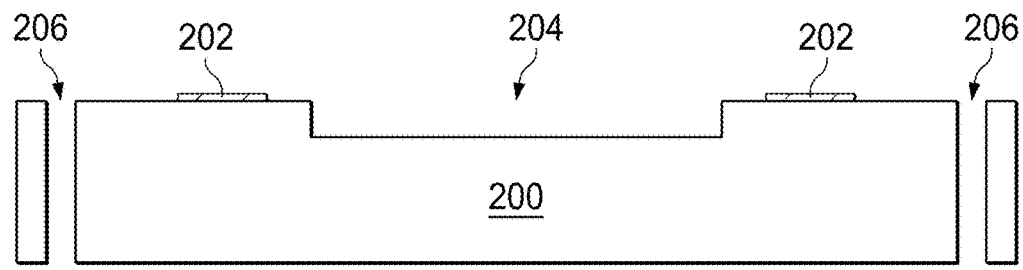
FIG. 2A1
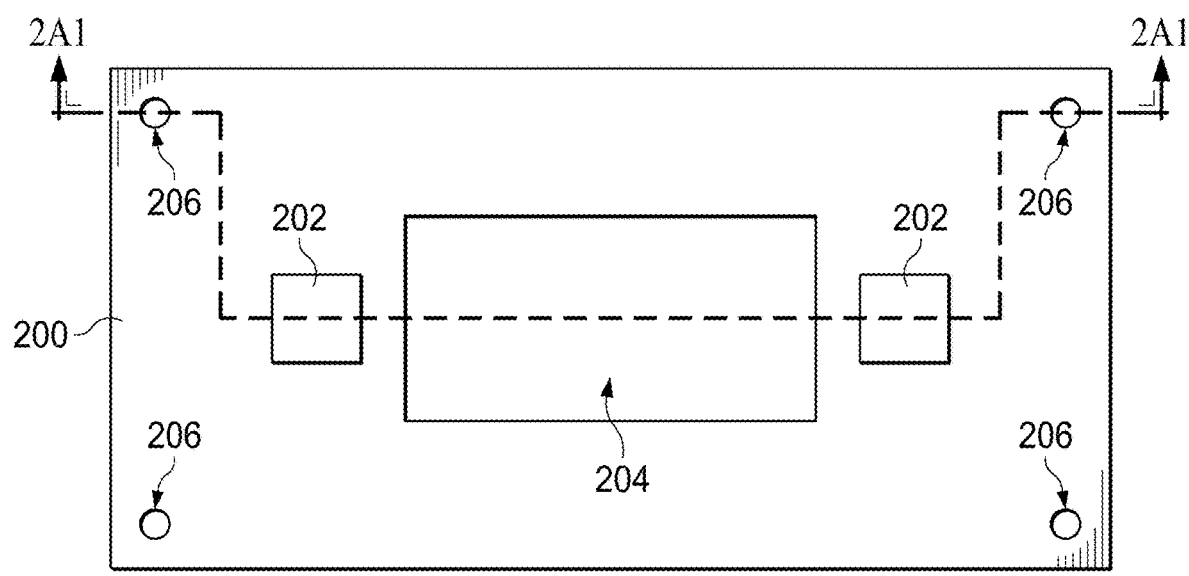
FIG. 2A2

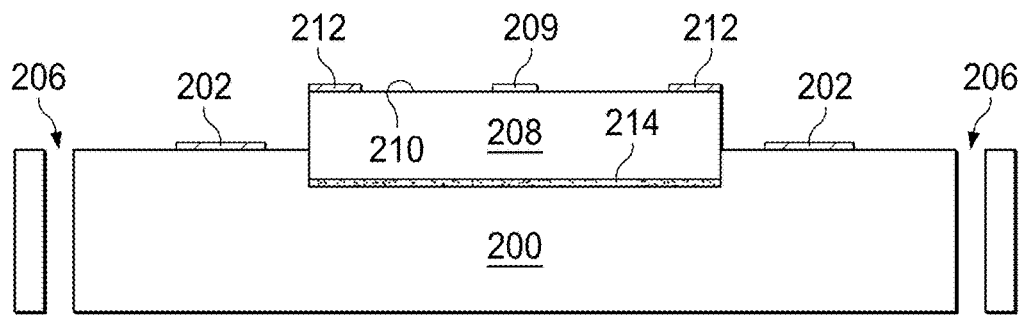
FIG. 2B1
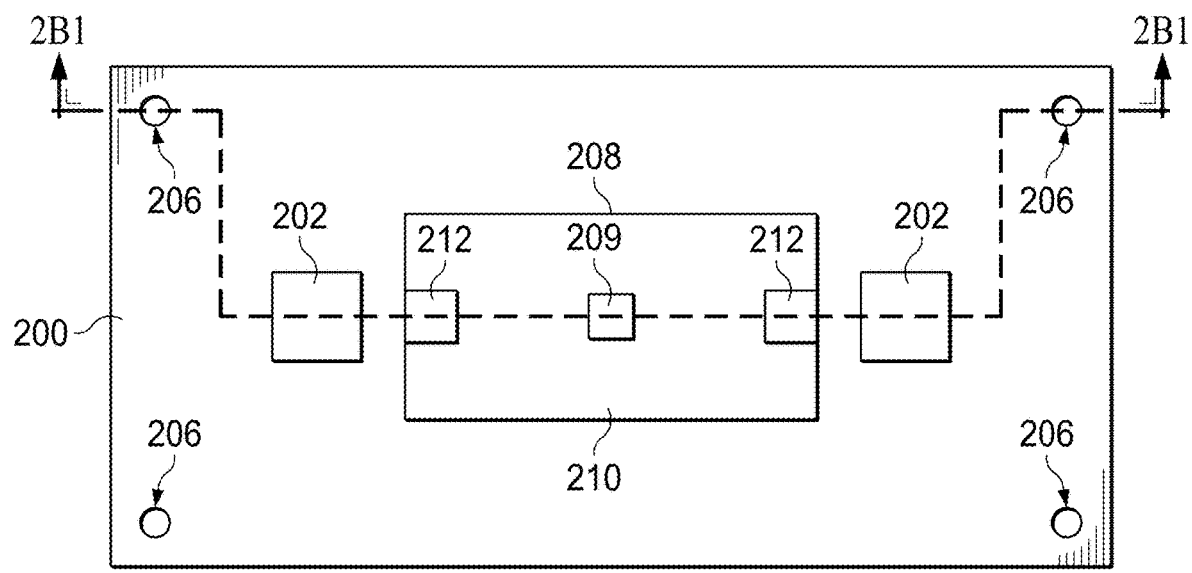
FIG. 2B2

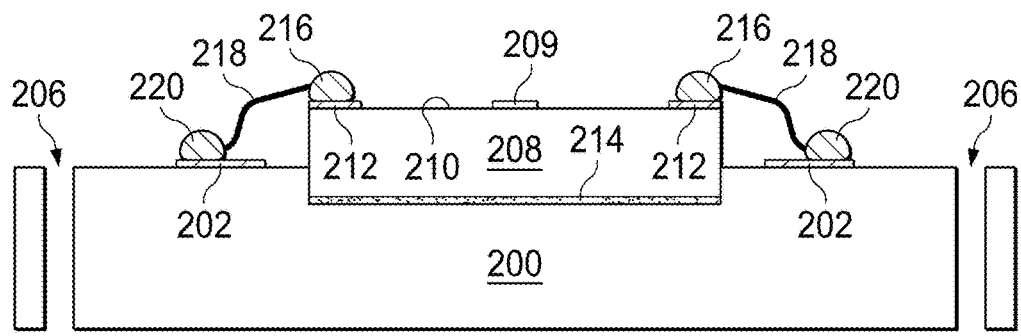
FIG. 2C1
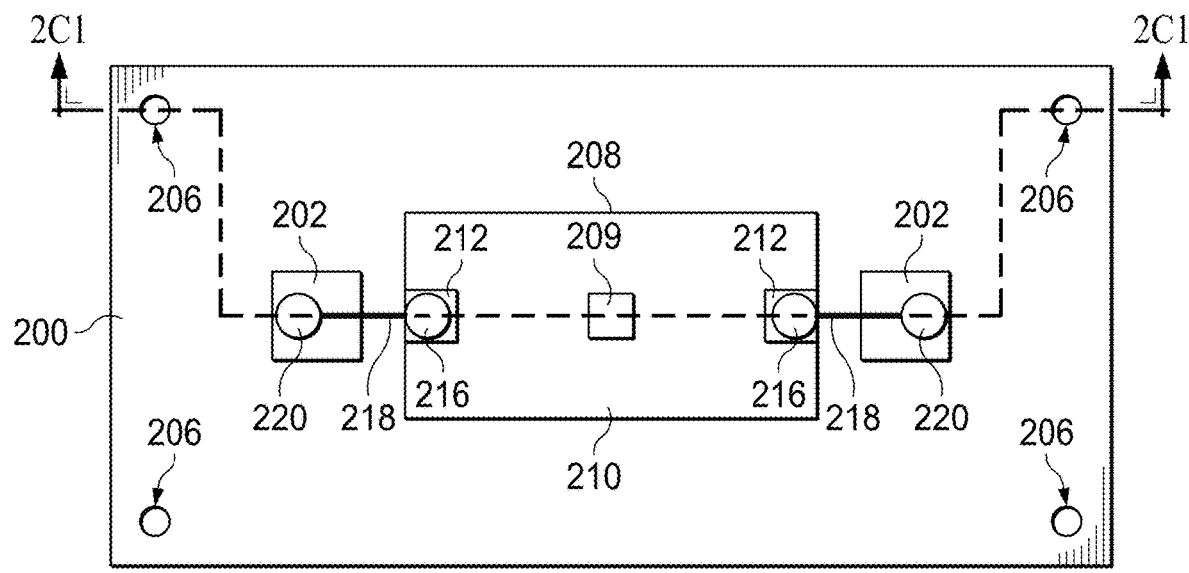
FIG. 2C2

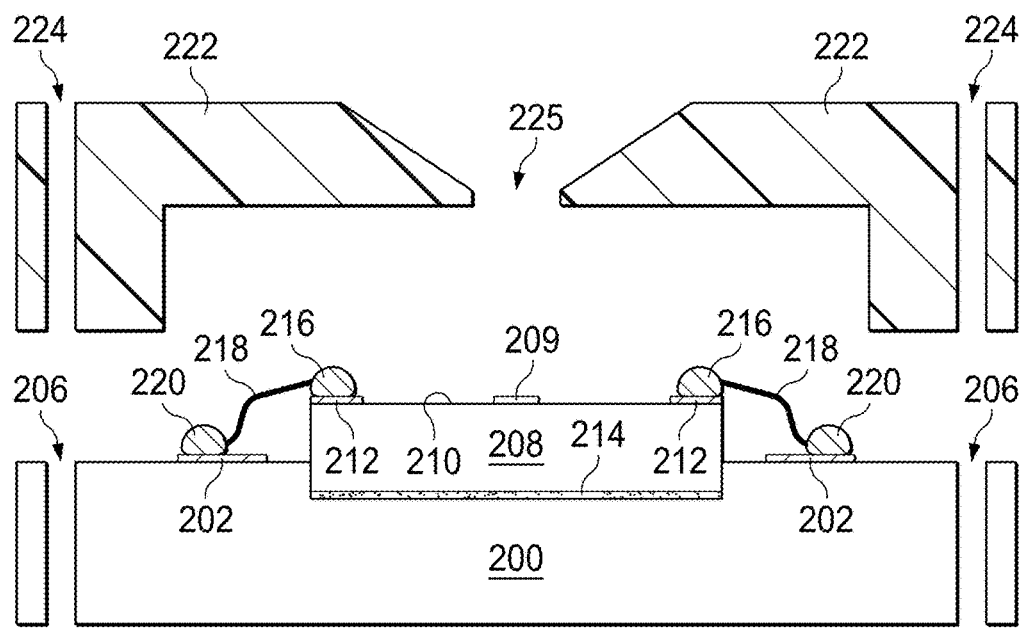
FIG. 2D1
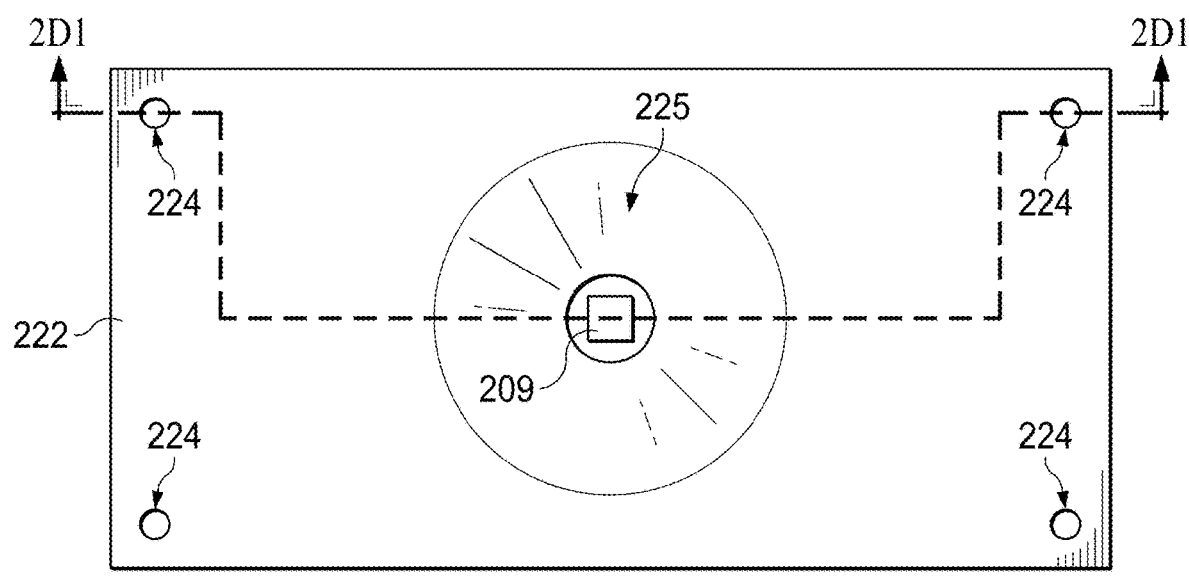
FIG. 2D2

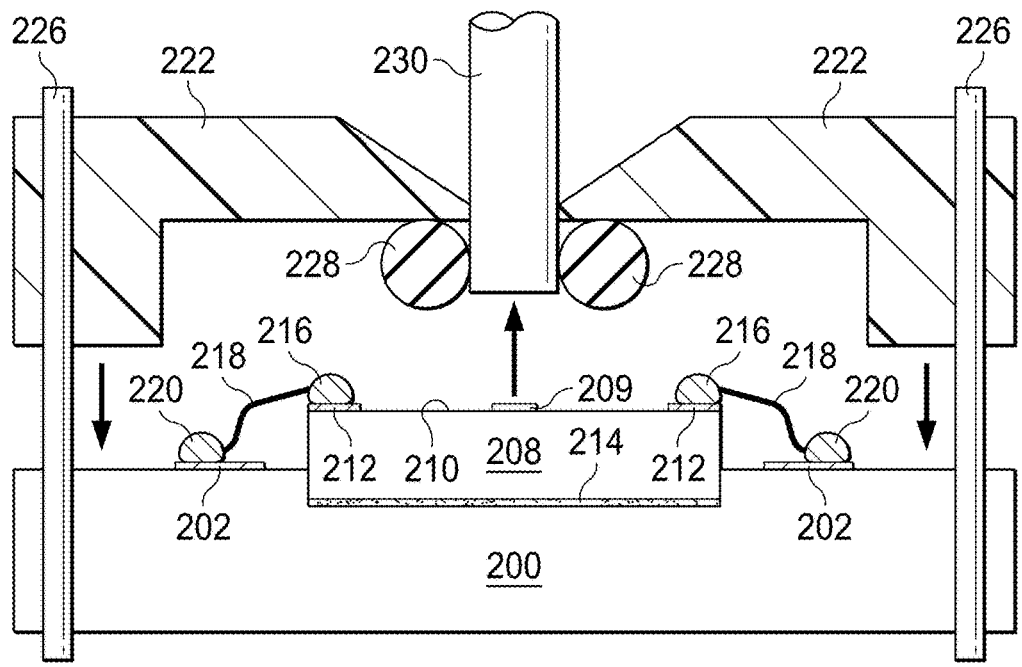
FIG. 2E1
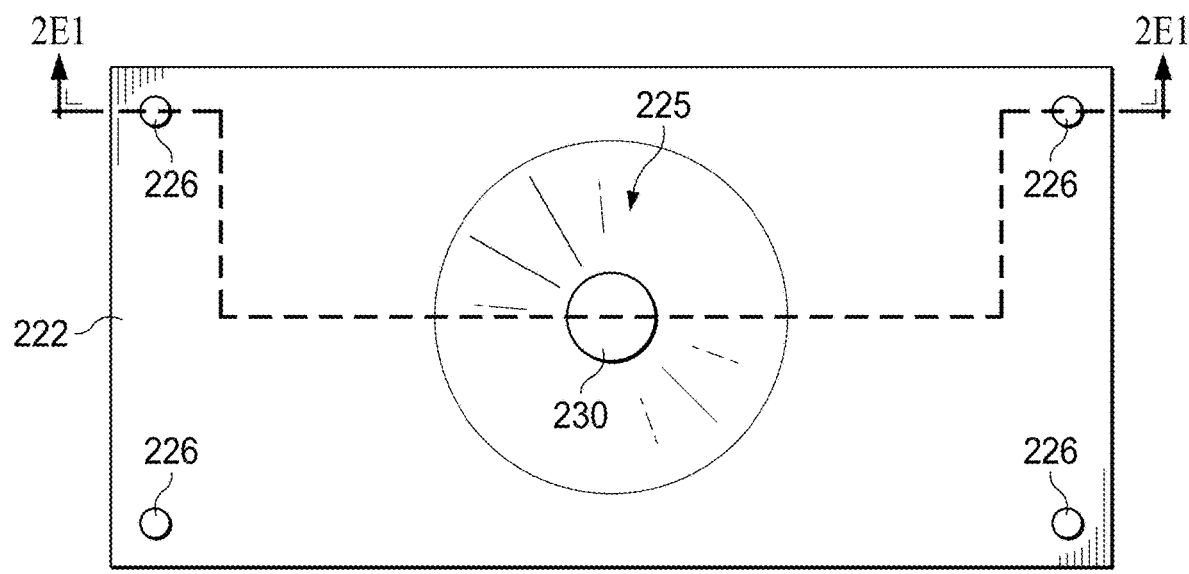
FIG. 2E2

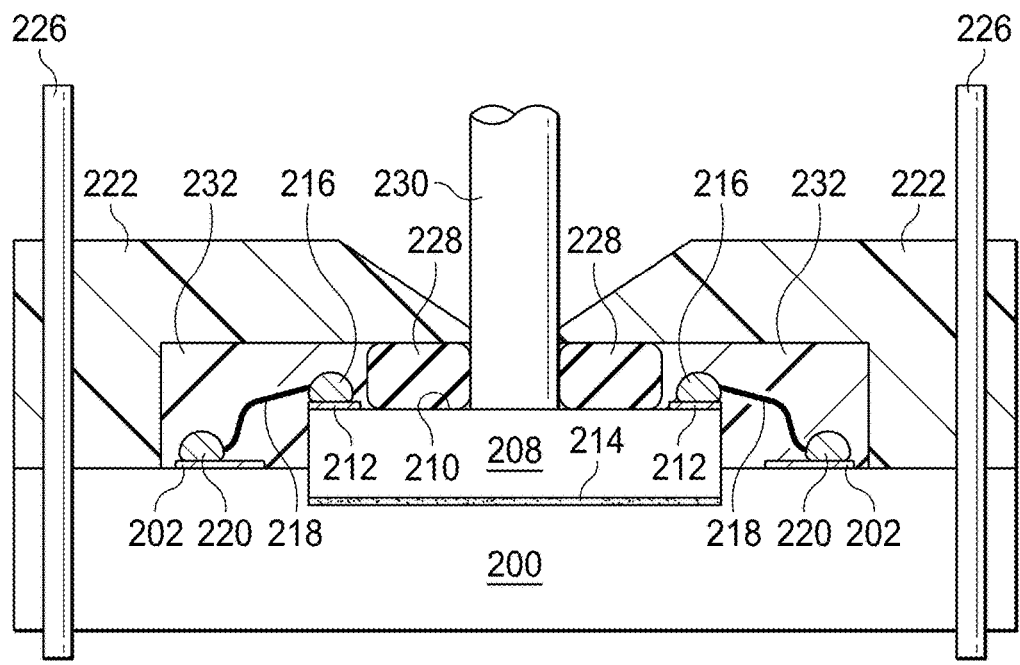
FIG. 2F1
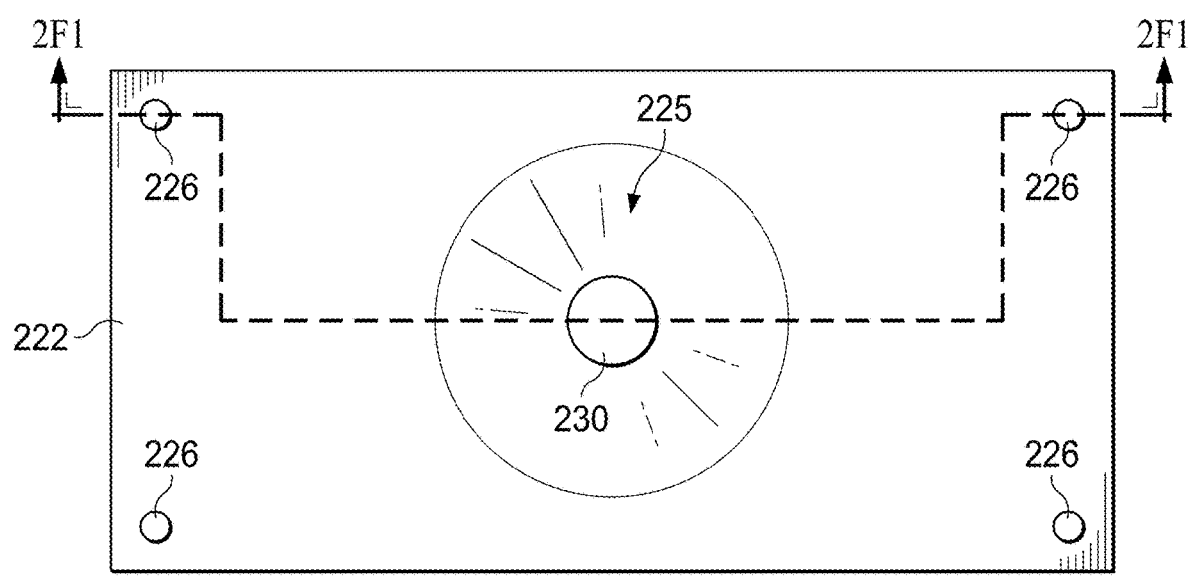
FIG. 2F2

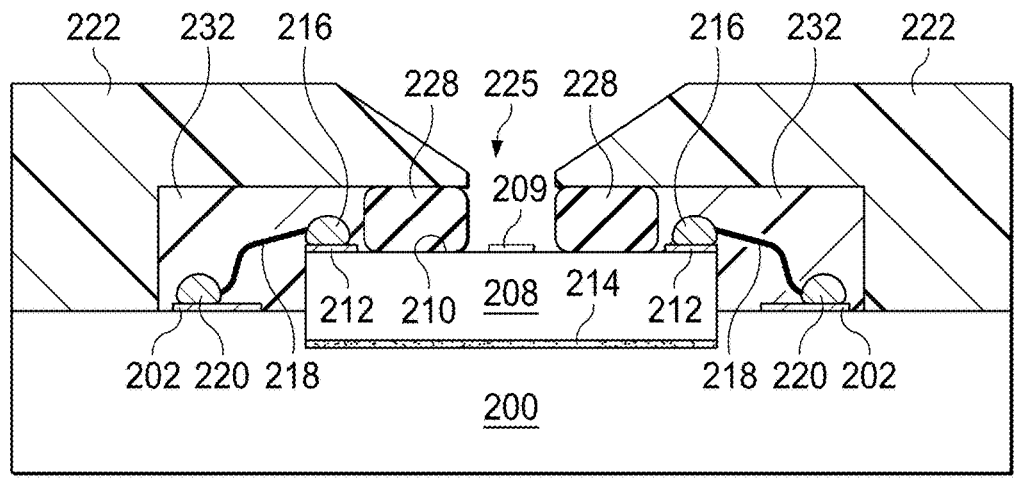
FIG. 2G1
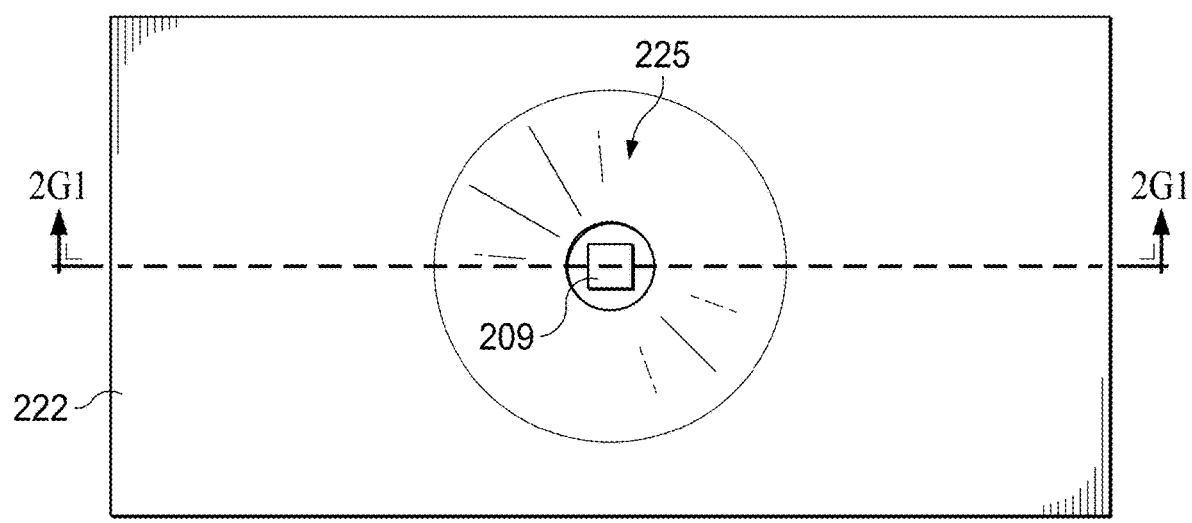
FIG. 2G2

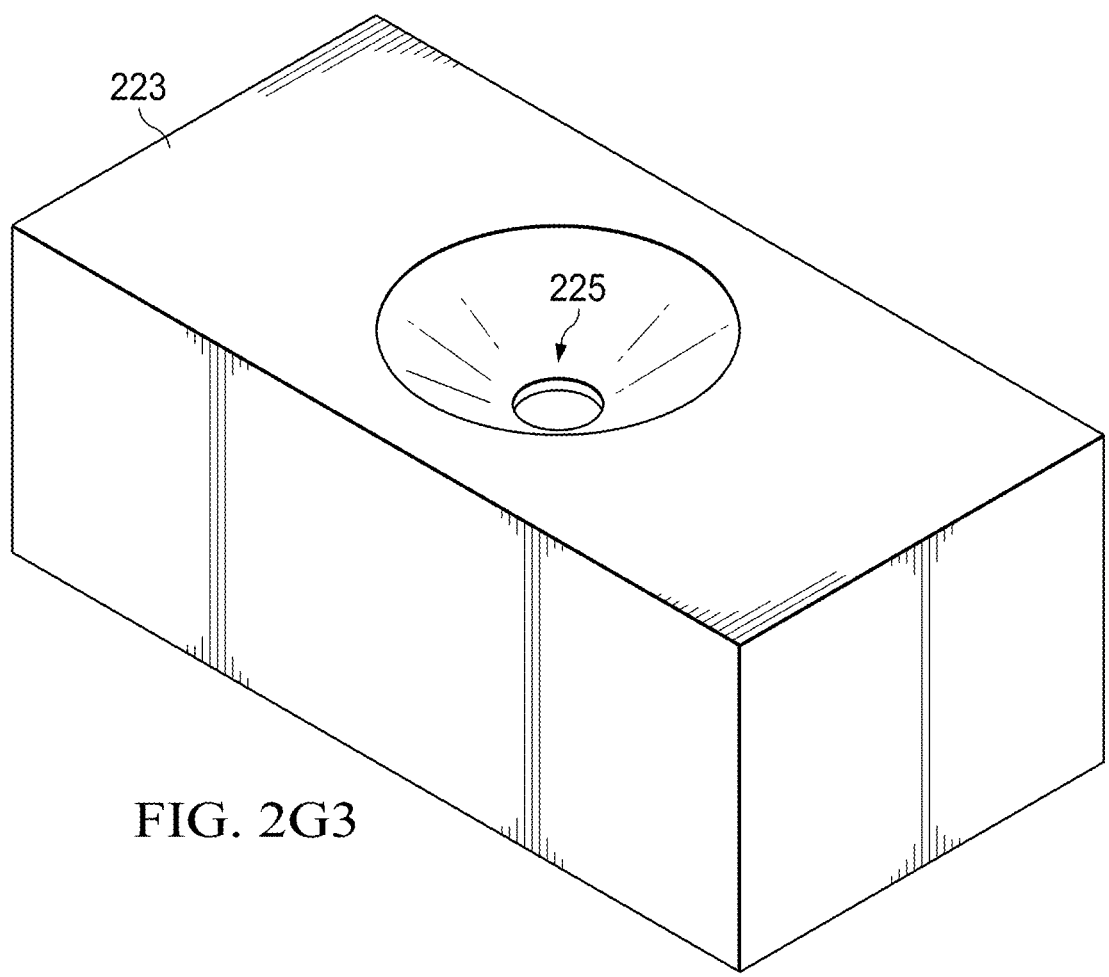
FIG. 2G3

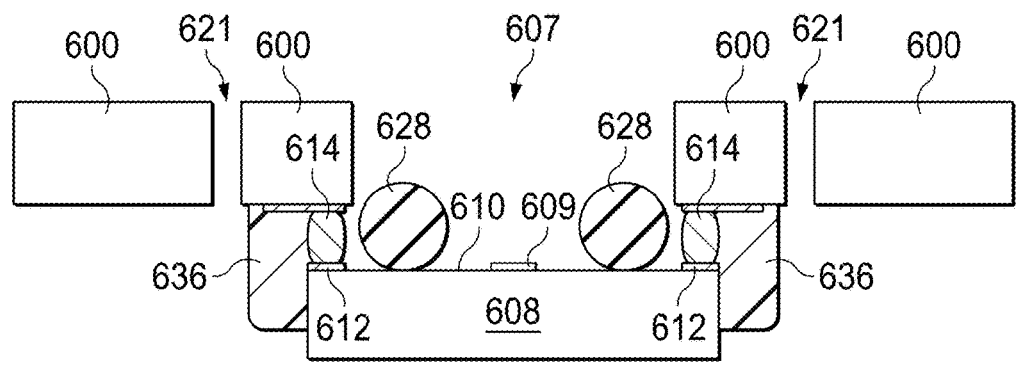
FIG. 6A1
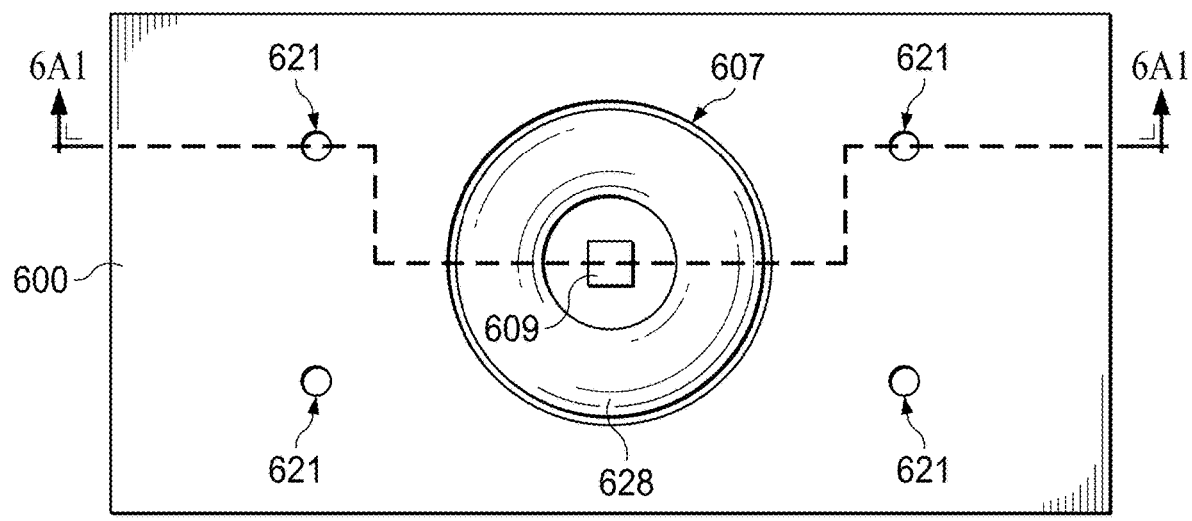
FIG. 6A2

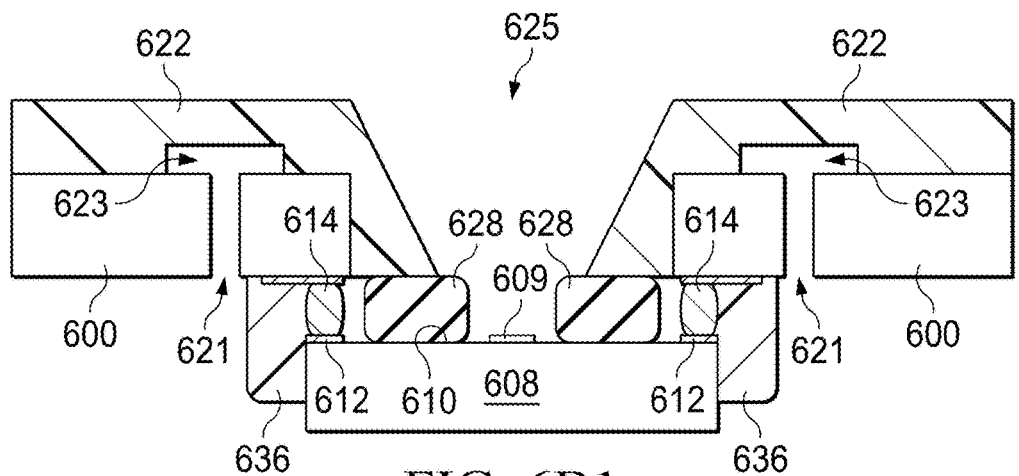
FIG. 6B1
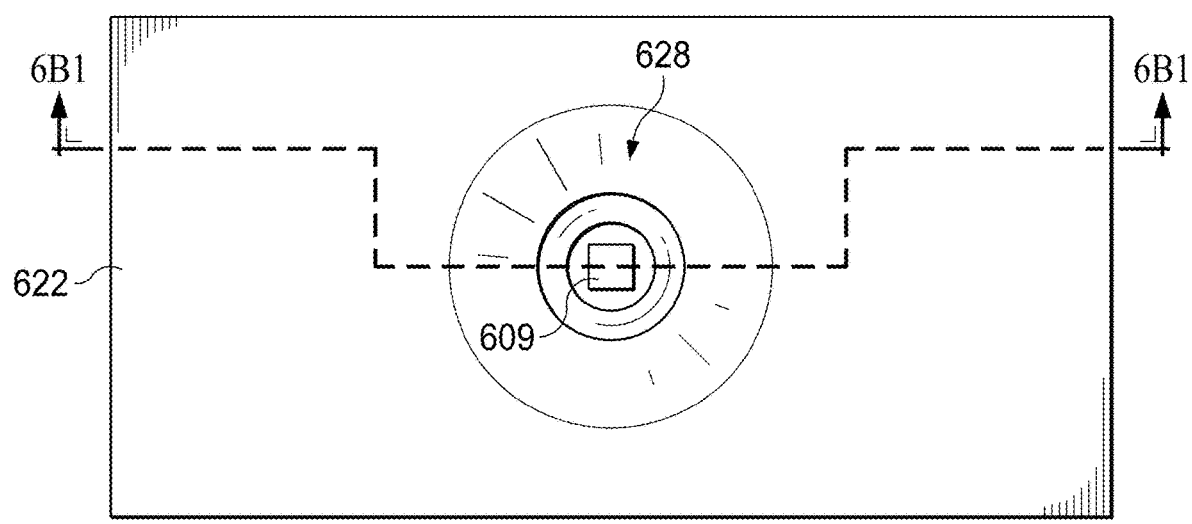
FIG. 6B2

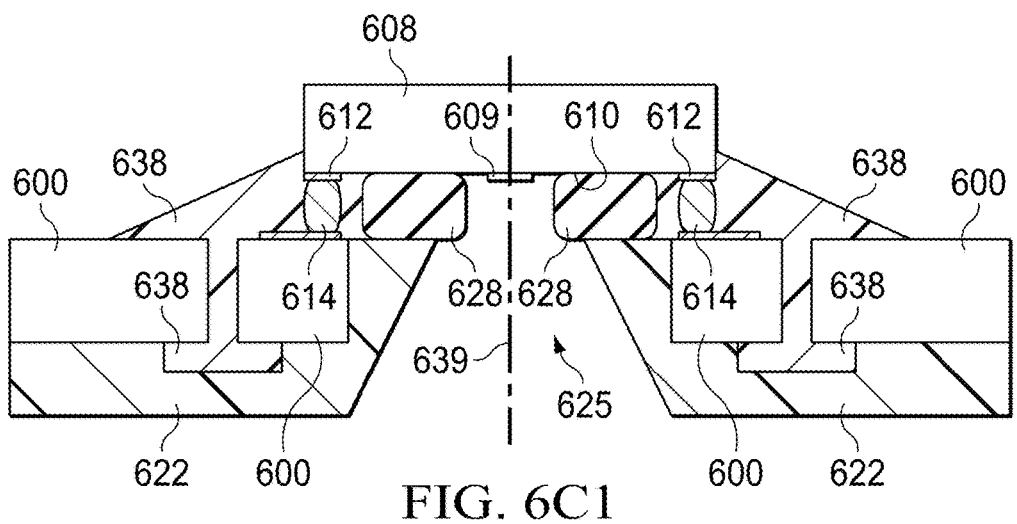
FIG. 6C1
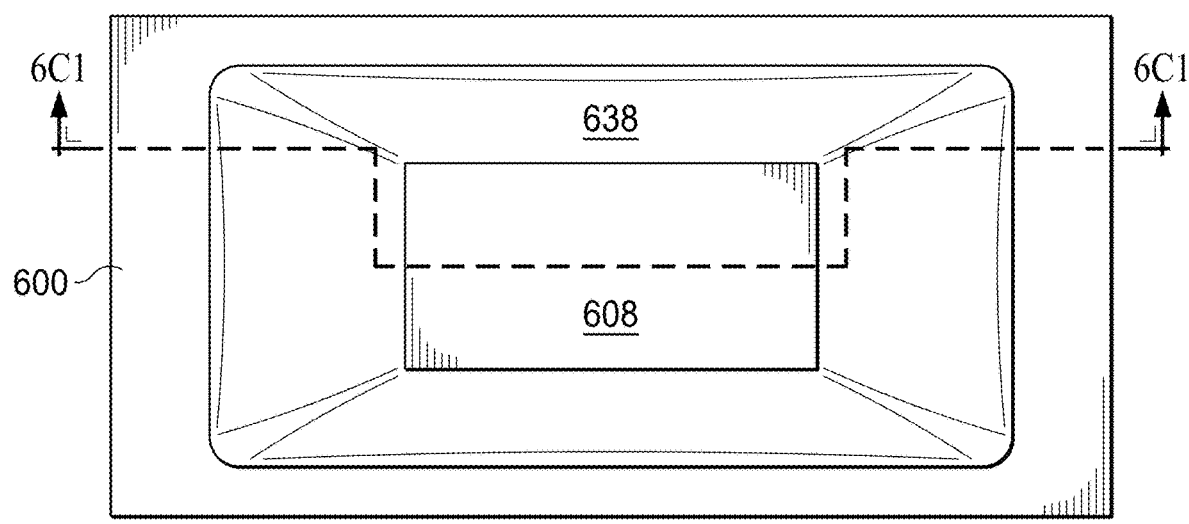
FIG. 6C2

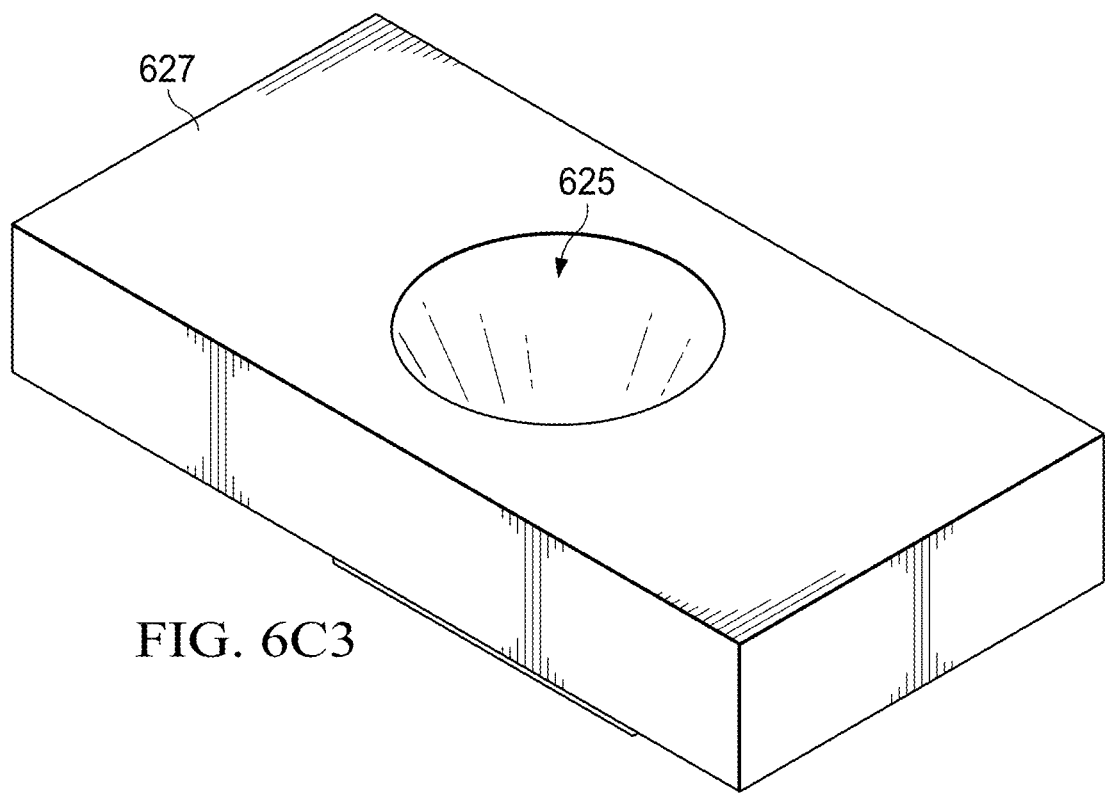
FIG. 6C3

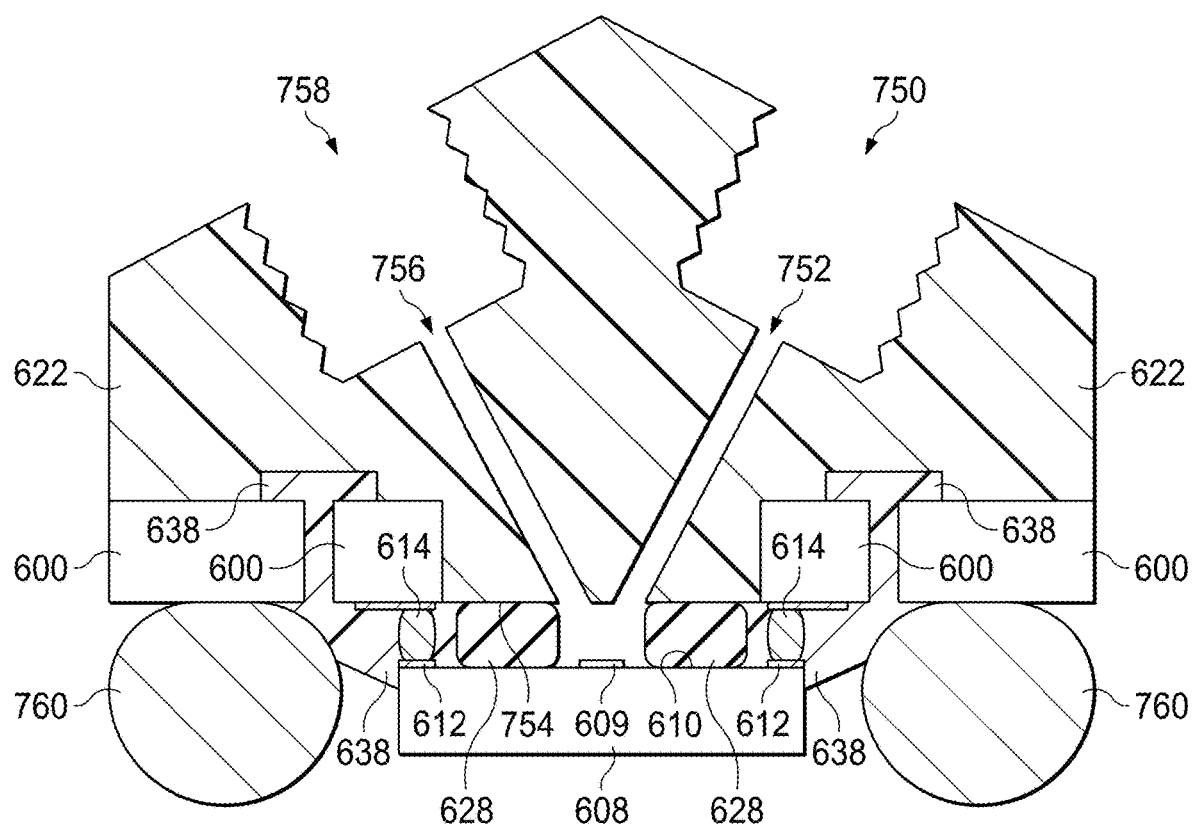
FIG. 7A1
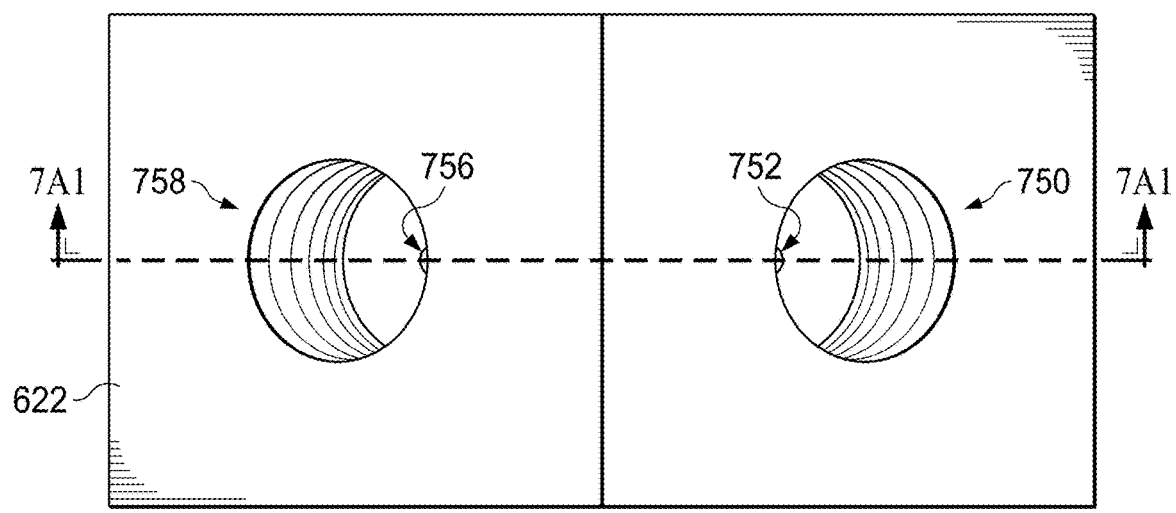
FIG. 7A2

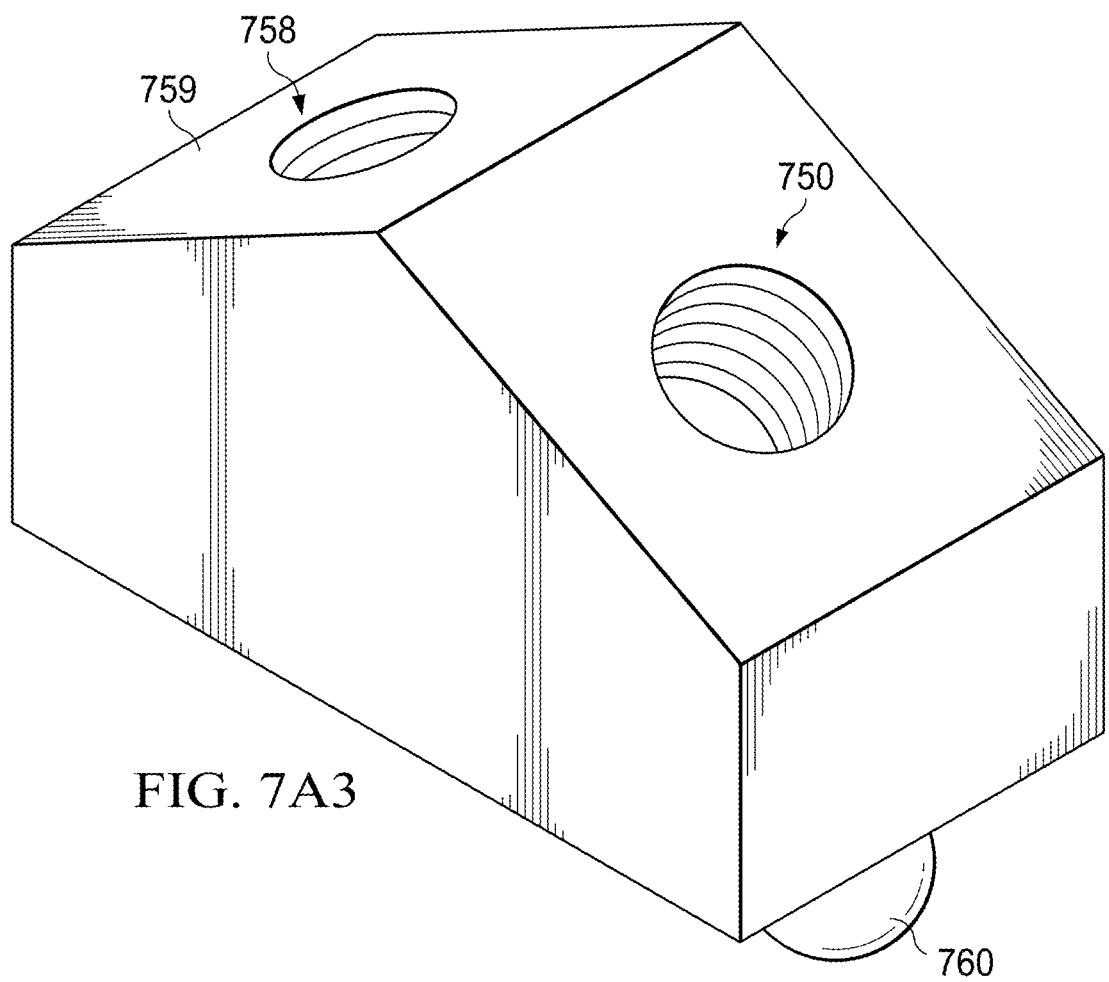
FIG. 7A3

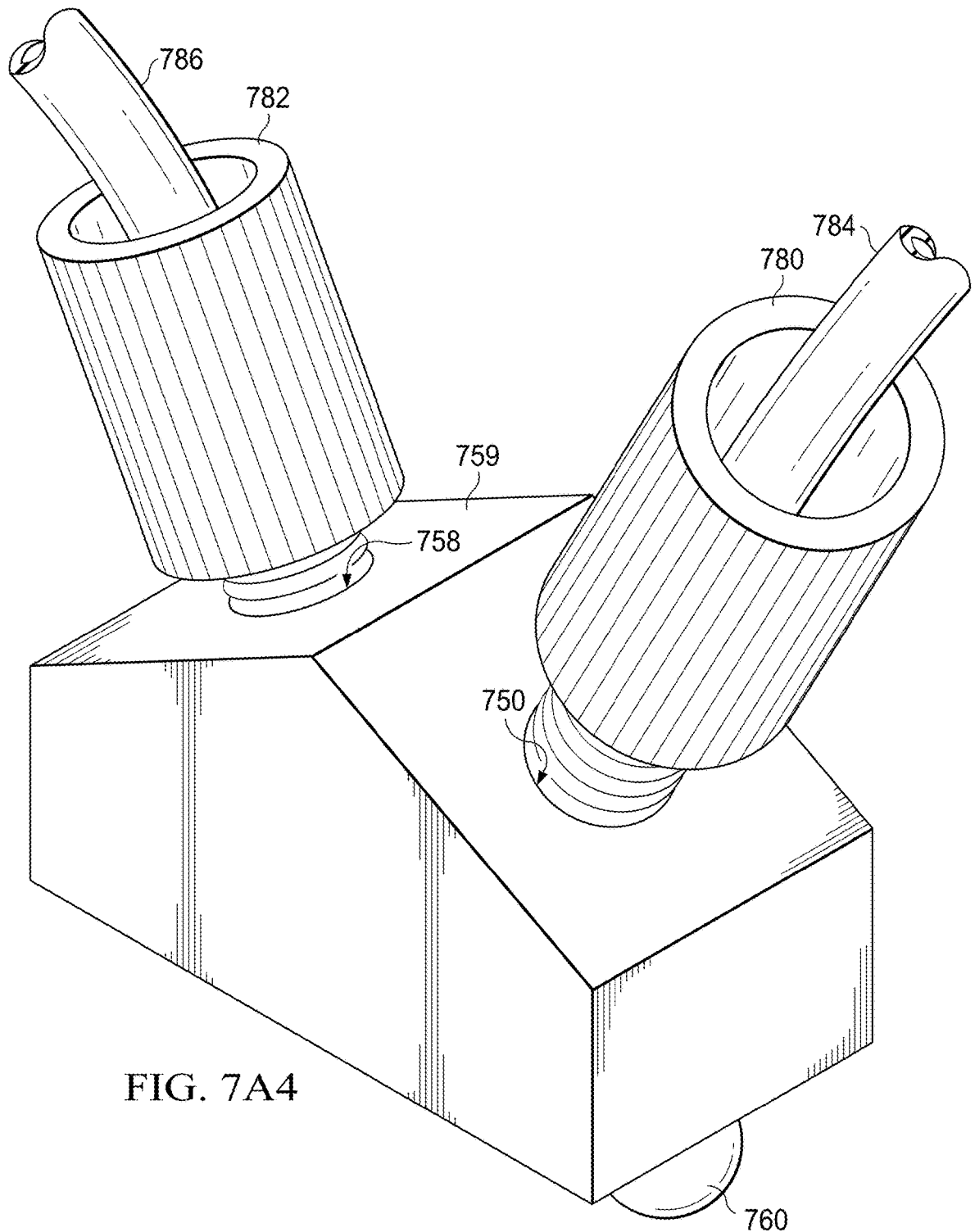
FIG. 7A4

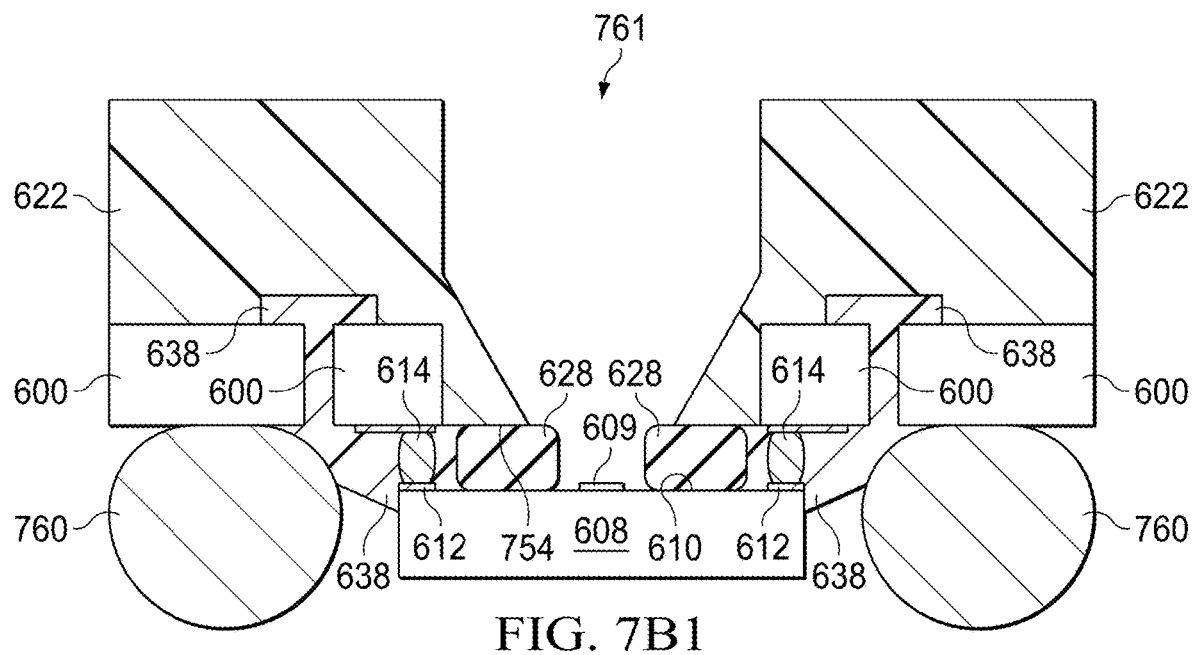
FIG. 7B1
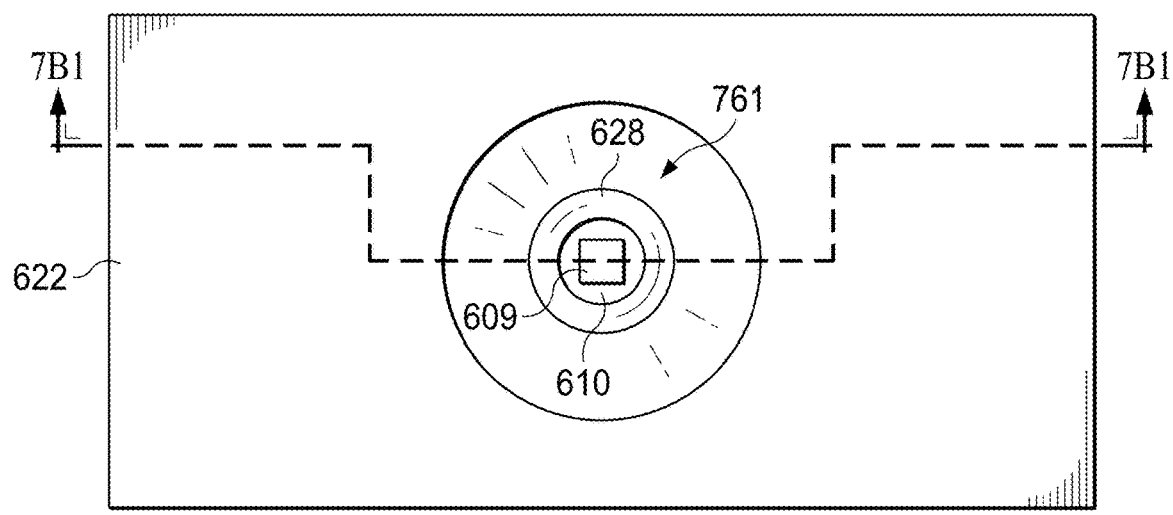
FIG. 7B2

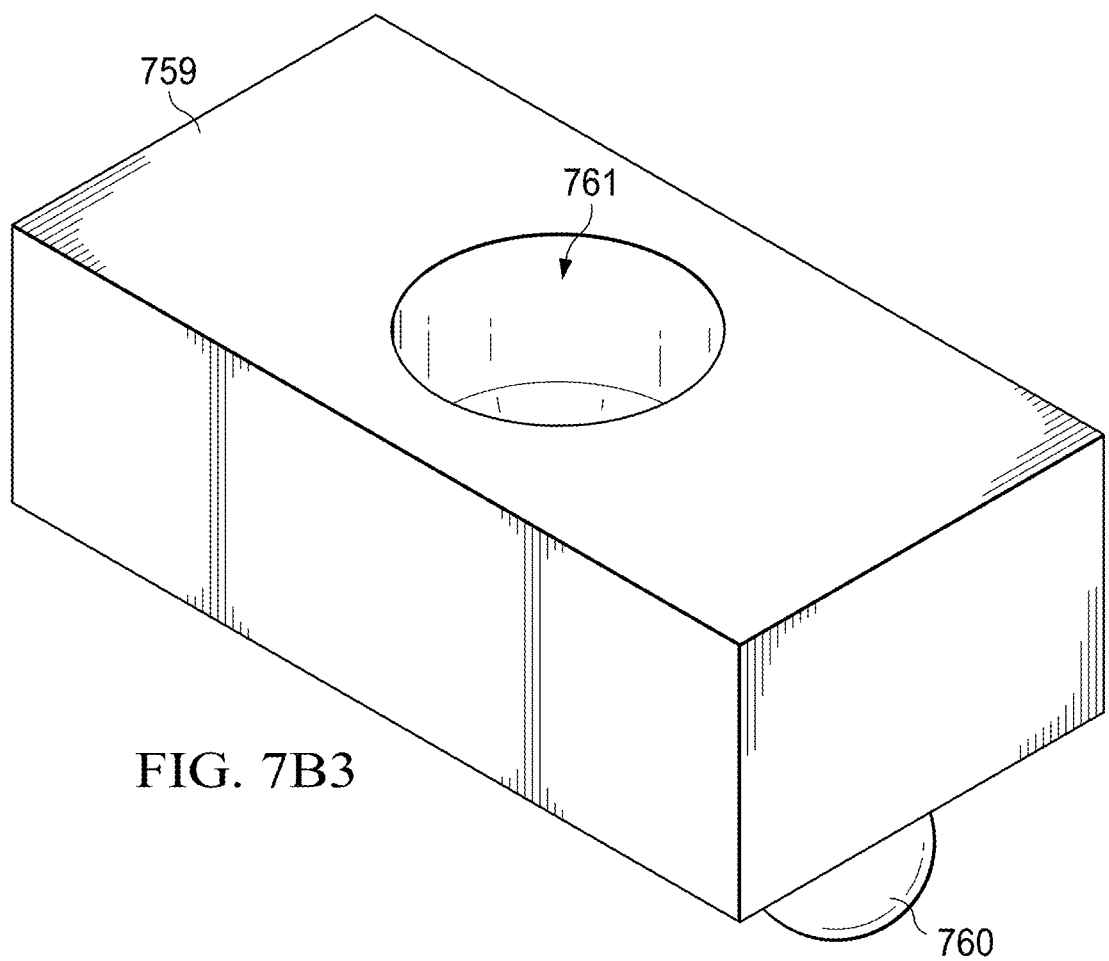
FIG. 7B3

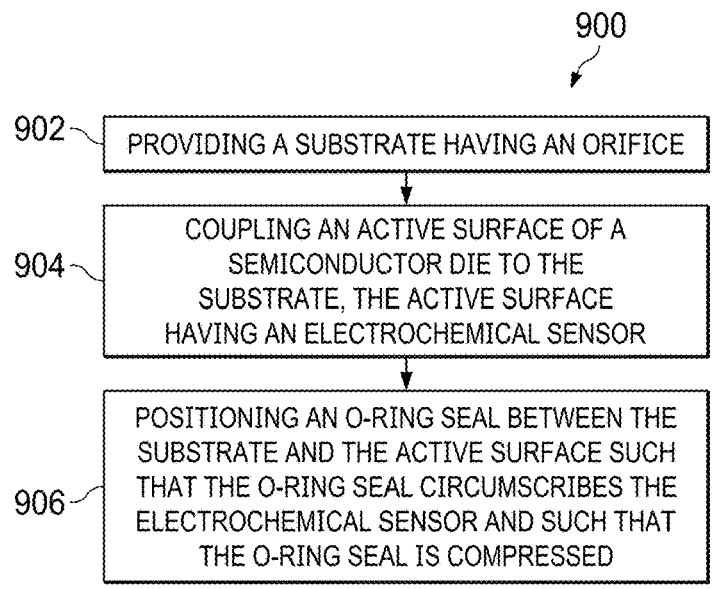
FIG. 9
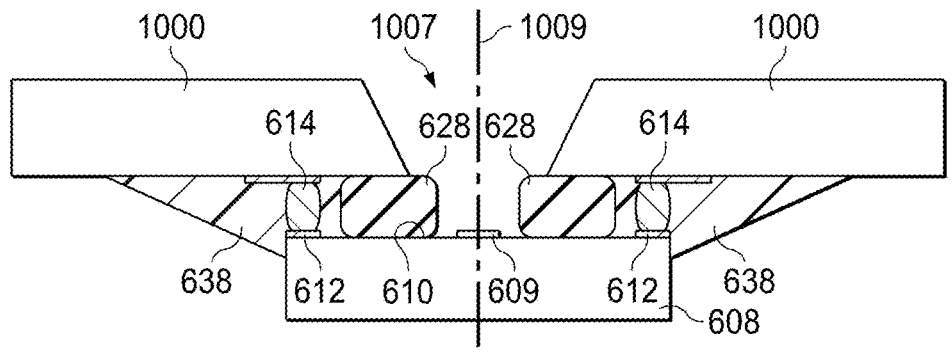
FIG. 10A1
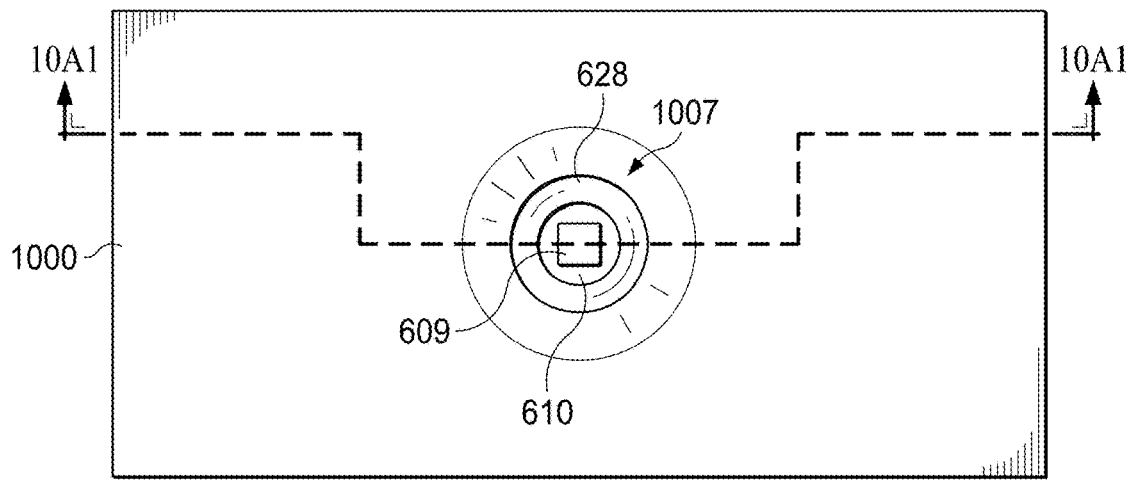
FIG. 10A2

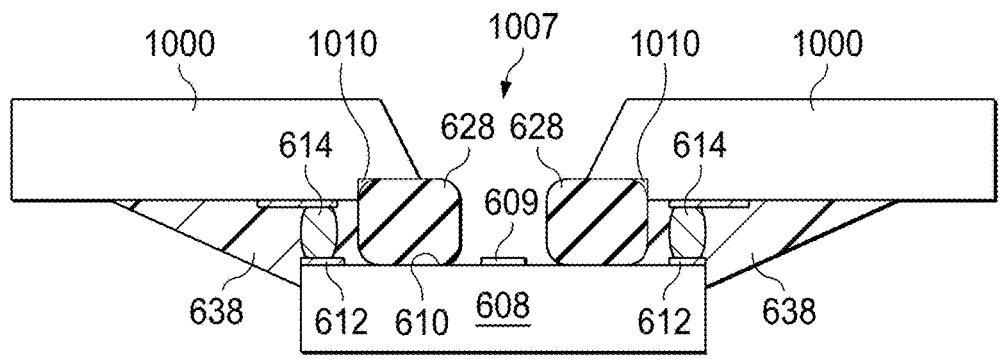
FIG. 10B1
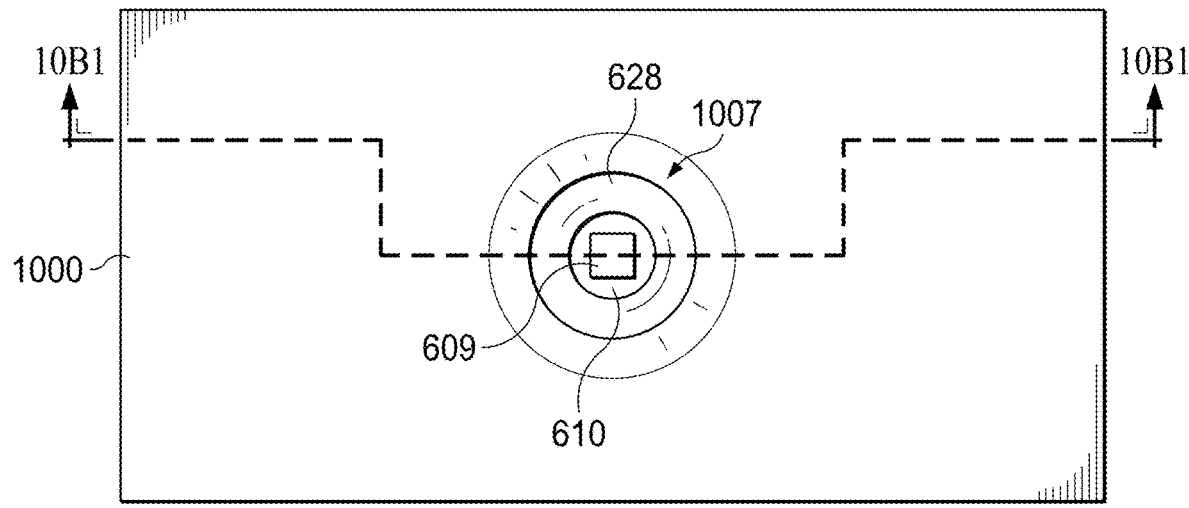
FIG. 10B2

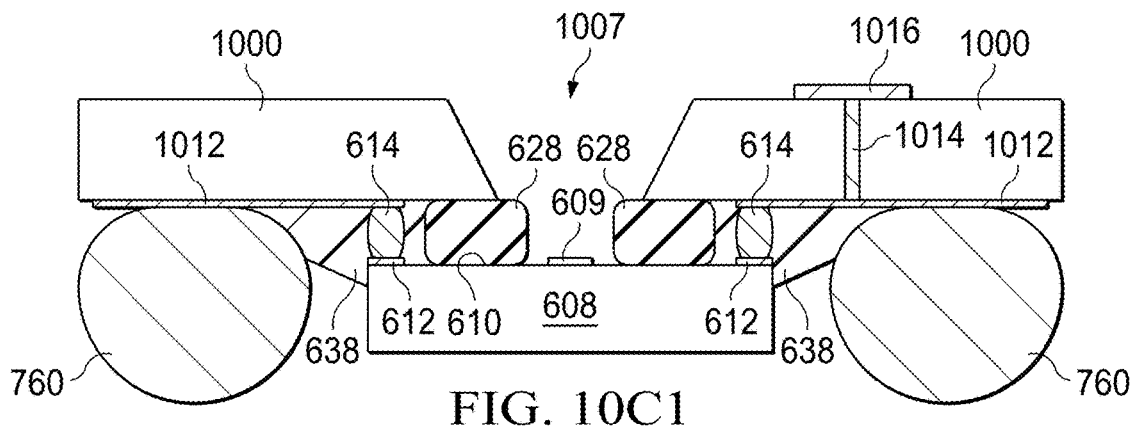
FIG. 10C1
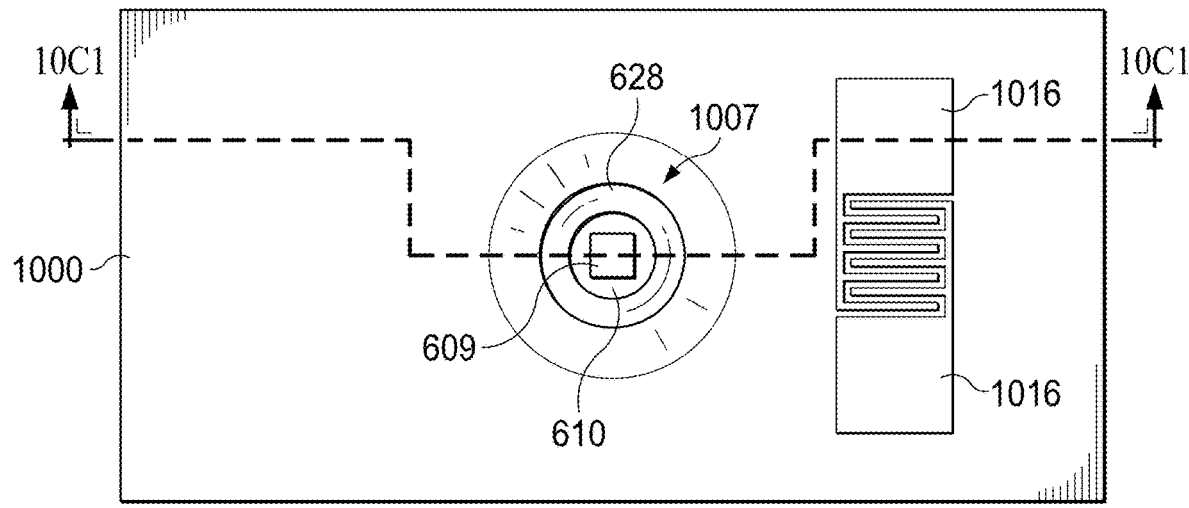
FIG. 10C2

O-RING SEALS FOR FLUID SENSING

CROSS-REFERENCE TO RELATED APPLICATION

This application is a continuation of U.S. patent Ser. No. 16/932,128, filed Jul. 17, 2020, which claims priority to U.S. Provisional Patent Application No. 62/875,369, which was filed Jul. 17, 2019, is titled "Chemically Inert Differential Electrochemical Sensor Package," and is hereby incorporated herein by reference in its entirety.

BACKGROUND

Electrical circuits are formed on semiconductor dies and subsequently packaged inside mold compounds to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals.

SUMMARY

In some examples, a device comprises a substrate including a notch formed in a surface of the substrate and a semiconductor die positioned in the notch and including an electrochemical sensor on an active surface of the semiconductor die. The device also comprises a chemically inert member abutting the surface of the substrate and including an orifice in vertical alignment with the electrochemical sensor as a result of the semiconductor die being positioned in the notch. The device also comprises a compressed o-ring seal positioned between the chemically inert member and the active surface of the semiconductor die, the compressed o-ring seal circumscribing the electrochemical sensor.

In some examples, a method comprises providing a substrate including a first orifice and coupling an active surface of a semiconductor die to the substrate, the active surface facing the substrate and including an electrochemical sensor. The method also comprises positioning an o-ring seal on the active surface via the first orifice of the substrate and compressing the o-ring seal using a chemically inert member.

BRIEF DESCRIPTION OF THE DRAWINGS

For a detailed description of various examples, reference will now be made to the accompanying drawings in which:

FIGS. 2A1-2G3 depict profile cross-sectional, top-down, and perspective views of a process flow for manufacturing an illustrative fluid sensing package, in accordance with various examples.

FIGS. 6A1-6C3 depict profile cross-sectional, top-down, and perspective views of a process flow for manufacturing an illustrative fluid sensing package, in accordance with various examples.

FIGS. 7A1-7B3 depict profile cross-sectional, top-down, and perspective views of illustrative fluid sensing packages, in accordance with various examples.

FIG. 9 is a flow diagram of a method for manufacturing an illustrative fluid sensing package, in accordance with various examples.

FIGS. 10A1-10C2 depict cross-sectional and top-down views of illustrative fluid sensing packages, in accordance with various examples.

DETAILED DESCRIPTION

Figure 1:
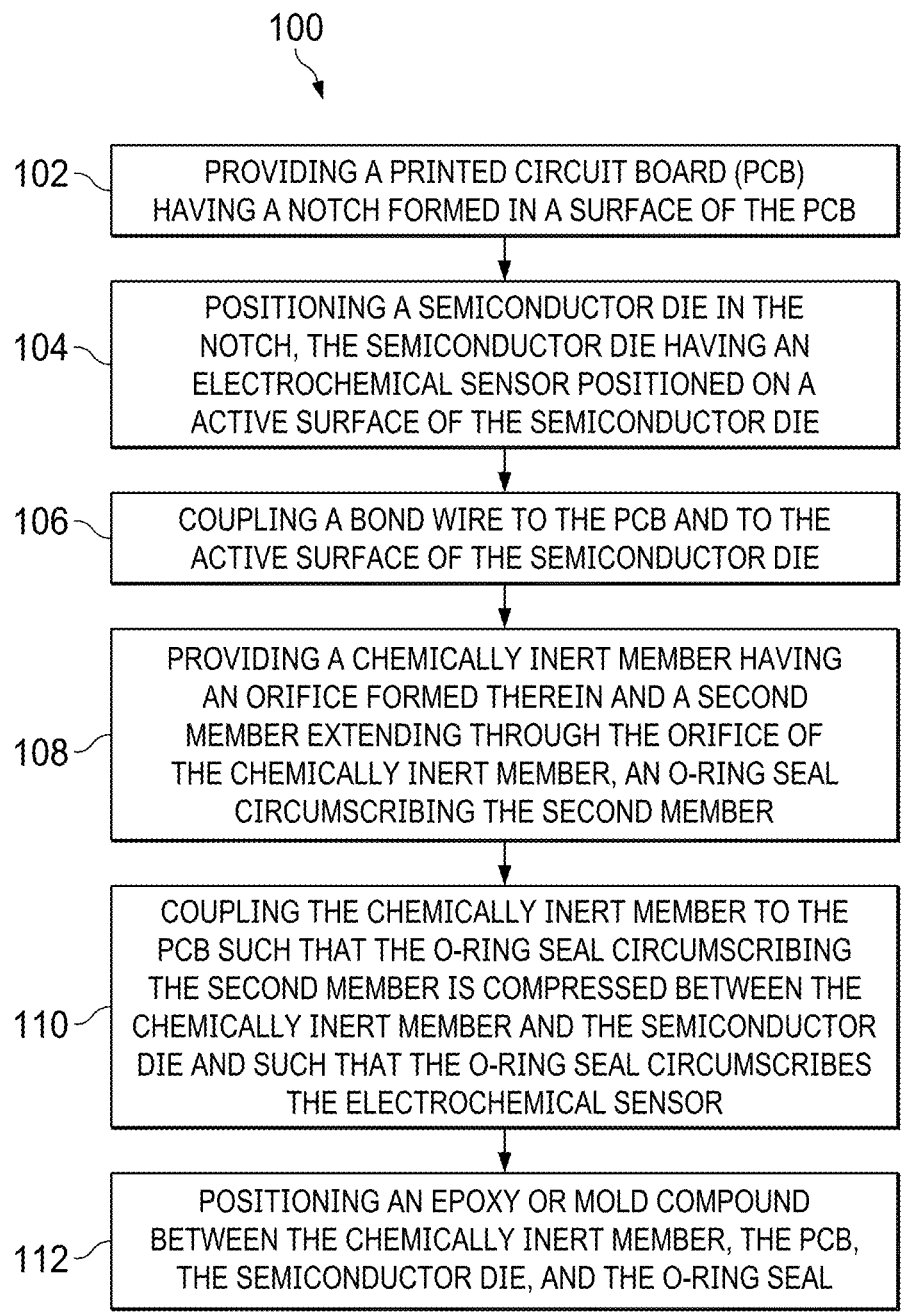
FIG. 1 depicts a flow diagram of a method for manufacturing an illustrative fluid sensing package, in accordance with various examples.

Some types of packages contain semiconductor dies that are configured to measure various properties of fluids. In many instances, the semiconductor die includes a fluid sensing portion, such as an electrochemical sensor, that is exposed directly to the fluid to be tested. Thus, for example, a semiconductor die that is configured to measure the various concentrations of chemicals in a swimming pool may be positioned in an area of the pool where the fluid sensing portion of the semiconductor die will be directly exposed to the pool water. Such packages are referred to herein as fluid sensing packages.

Commonly-used fluid sensing packages suffer from a number of drawbacks. These drawbacks generally arise from the material used to isolate, or seal, the fluid sensing portion of the package from other circuitry and structures of the package. In some cases, the seal used does not properly adhere to the package structures to which the seal is intended to adhere. For example, the seal is often positioned on an active surface of a semiconductor die, such as the active surface that contains the fluid sensing portion. In such applications, the seal may adhere sub-optimally to the semiconductor die, leaving other parts of the package (e.g., circuitry on the active surface of the semiconductor die) vulnerable to fluid ingress. In addition, in some cases the seal is not mechanically robust, meaning that the seal itself lacks the structural integrity to consistently and effectively block fluid ingress over an extended period of time, especially when the fluid is under pressure, such as when the sensor is mounted in an industrial pipe or in high pressure liquid chromatography (HPLC). Commonly used seals are similarly unable to withstand variations in temperature, such as may occur during the manufacturing process or during use in the field. Seals are not chemically inert, meaning that they may negatively influence the fluid sensing portion's ability to accurately measure characteristics, such as conductivity, pH, or other ion concentrations of the fluid being tested. Furthermore, the seals that are commonly used may cause ion absorption and out-diffusion, meaning that when two different fluids are serially tested using the same fluid sensing package, the seal may absorb ions from the first fluid and release those absorbed ions into the second fluid. This may negatively impact sensor response time and measurement accuracy, such as pH measurement accuracy, for the first fluid, the second fluid, or both fluids. Further still, while some seals may suffer from fewer of the aforementioned drawbacks, fluid sensing packages incorporating such seals are manufactured using non-standard techniques to facilitate integration with other devices into an electronic device, which results in substantially increased costs.

This disclosure describes various examples of a fluid sensing package that overcomes the challenges described above. The fluid sensing packages described herein include o-ring seals that block undesirable fluid ingress to parts of the fluid sensing packages that may be damaged by contact with fluid. In some examples, an o-ring seal is positioned on an active surface of a semiconductor die. The o-ring seal circumscribes a fluid sensing portion, or a sensor, that is formed on the active surface of the semiconductor die. The fluid sensing package also includes a chemically inert member (e.g., composed of polyether ether ketone (PEEK) or polytetrafluoroethylene (PTI-B)). A chemically inert member (or material) is one that does not negatively influence a fluid sensor's ability to accurately measure characteristics, such as conductivity, pH, or other ion concentrations of the fluid being tested. The chemically inert member may be shaped in such a way that it both compresses the o-ring seal (reducing the thickness of the o-ring seal by, e.g., 10 to 40 percent of the o-ring seal in an uncompressed state) and funnels the fluid to be tested toward the sensor that is circumscribed by the o-ring seal. In examples, the o-ring seal is composed of a chemically inert, durable material that can withstand wide temperature fluctuations, such as silicone, synthetic rubbers, or thermoplastics. In addition, the o-ring seal may be highly conformal such that it maintains firm contact with the active surface of the semiconductor die. Furthermore, the o-ring seal is not susceptible to ion absorption, thus preventing subsequent out-diffusion that can negatively impact the accuracy of sensor measurements. In addition, the materials used in the fluid sensing packages described herein are less expensive compared to alternative solutions. Further still, the fluid sensing packages described herein may include wirebond or flip-chip connections between a substrate and the semiconductor die on which the sensor is formed. Compared to other fluid sensing packages, wirebonded or flip-chip fluid sensing packages that implement o-ring seals are less expensive and more compatible with other existing technologies, thus facilitating heterogeneous integration with such other technologies. The examples described herein may be implemented in a wide variety of applications, including home appliances, automobiles, aircraft, medical devices, and others. In addition, although the examples described herein are in the context of fluid sensing, the same or similar examples may be used for gas sensing applications as well. Thus, terms such as fluid sensing, fluid sensing portions, fluid sensors, etc. may be understood to encompass gas sensors as well.

Various example fluid sensing packages are now described with reference to the drawings. At least some drawings depict portions of fluid sensing packages but may omit certain application-specific details to enhance clarity regarding o-ring seals and other structures involved in preventing undesirable fluid ingress. For example, at least some drawings omit details regarding metallization on substrates (e.g., printed circuit boards), which can be application-specific. For example, at least some drawings omit details regarding the manner in which a particular fluid sensing package may couple to a substrate or other device (e.g., solder bumps in a ball grid array style package), which can be application-specific. For example, at least some drawings omit details regarding specific types of covering materials (e.g., certain types of mold compounds, polyether ether ketone (PEEK)) that may be used to cover the structures depicted in those drawings, which can be application-specific. Drawings that depict fewer than all components of a fluid sensing package are still considered to be part of a fluid sensing package should not be interpreted to limit the scope of this disclosure.

FIG. 1 depicts a flow diagram of a method 100 for manufacturing an illustrative fluid sensing package, in accordance with various examples. FIGS. 2A1-2G3 depict profile cross-sectional, top-down, and perspective views of a process flow for manufacturing an illustrative fluid sensing package, in accordance with various examples. The method 100 may be used to implement the process flow depicted in FIGS. 2A1-2G3. Accordingly, FIGS. 1 and 2A1-2G3 are now described in parallel.

The method 100 begins by providing a substrate, such as a printed circuit board (PCB), having a notch formed in a surface of the substrate (102). For purposes of this description, the substrate is assumed to be a FR-4 PCB, but the scope of this disclosure is not limited to FR-4 PCB substrates. Other substrates are contemplated and may be used in lieu of an FR-4 PCB, for example, polytetrafluoroethylene (PTFE) PCBs, polyimide PCBs, ceramic PCBs, metal PCBs, resin-based laminates, ceramic chip carriers (CC), lead frames, transistor outline (TO) packages, etc. FIG. 2A1 depicts an example PCB 200 having a notch 204 and bond pads 202 (e.g., gold bond pads) formed on or in a top surface of the PCB 200. In examples, the PCB 200 includes alignment rod orifices 206 that extend through a thickness of the PCB 200, as shown. In examples, the notch 204 is a cavity in the PCB 200 that has a length ranging from 1 mm to 30 mm, a width ranging from 1 mm to 30 mm, and a depth ranging from 0.1 mm to 2.0 mm. These parameters are not mere design choices. Rather, the length, width, and depth of the notch 204 introduces advantages and disadvantages to the fluid sensing package being manufactured. For example, a smaller notch 204 size correlates to a smaller size of a semiconductor die that fits in the notch 204 (as described below), which results in lower cost per chip. Conversely, a larger notch 204 size correlates to decreased requirements for precision alignment between the notch 204 and the semiconductor die that fits inside the notch 204. FIG. 2A2 depicts a top-down view of the structure of FIG. 2A1. As shown in FIG. 2A2, the PCB 200 may include multiple (e.g., four) alignment rod orifices 206. The specific positions of the alignment rod orifices 206 and the bond pads 202 are application-specific and may vary. In examples, the alignment rod orifices 206 and the notch 204 are formed using a computer numerical control (CNC) machine.

Referring again to FIG. 1, the method 100 subsequently comprises positioning a semiconductor die in the notch, the semiconductor die having an electrochemical sensor positioned on an active surface of the semiconductor die (104). FIG. 2B1 depicts an example structure that may be formed by performing (104). Specifically, FIG. 2B1 depicts the same example structure shown in FIGS. 2A1 and 2A2, but FIG. 2B1 further includes a semiconductor die 208 positioned in the notch 204. For example, a die attach layer 214 may be used to couple the semiconductor die 208 to the PCB 200 in the notch 204. In examples, the semiconductor die 208 has an active surface 210 on (and/or in) which circuitry (e.g., an integrated circuit, not expressly shown) may be formed. In examples, the active surface 210 (and thus, by extension, the semiconductor die 208) includes a sensor 209, such as an electrochemical sensor (e.g., an ion-sensitive field effect transistor (ISFET)), with, for example, three-dimensional (3D) micro-electro-mechanical structures (MEMS), chemically sensitive membranes, or inert metal electrodes that may be exposed to fluid to be tested. The active surface 210 also includes bond pads 212. The bond pads 212 may couple to circuitry formed on the active surface 210. The number and positions of the bond pads 212 is application-specific and, thus, may vary. FIG. 2B2 depicts a top-down view of the structure of FIG. 2B1.

Referring again to FIG. 1, the method 100 then comprises coupling a bond wire to the PCB and to the active surface of the semiconductor die (106). FIG. 2C1 depicts bond wires 218 coupled to balls 216, 220 on bond pads 212, 202, respectively, as shown. In examples, the bond wires 218 have a low profile, meaning that the bond wires 218 do not have upward trajectories upon exiting the balls 216. Low-profile bond wires 218 are advantageous because they do not interfere with the appropriate placement of a chemically inert member (as described below), which, in turn, facilitates the appropriate placement of an o-ring seal to block undesirable fluid ingress. Low profiles may be achieved, for instance, by using a stitching technique to couple the bond wires 218 to the balls 216 and/or to the balls 220. Any suitable material may be used for the bond wires 218 and the balls 216, 220. FIG. 2C2 depicts a top-down view of the structure of FIG. 2C1.

The method 100 next includes providing a chemically inert member having an orifice formed therein and a second member extending through the orifice of the chemically inert member, with an o-ring seal circumscribing the second member (108). FIG. 2D1 depicts a chemically inert member 222 having an orifice 225 and alignment rod orifices 224 positioned above the structure of FIG. 2C1 in preparation for a coupling process. In particular, the alignment rod orifices 224 are vertically aligned with the alignment rod orifices 206, for example with the assistance of alignment rods described below. Vertical alignment of these alignment rod orifices 206, 224 facilitates vertical alignment of the sensor 209 with the orifice 225. For example, a vertical axis extending through a center of the orifice 225 may likewise extend through the sensor 209. This alignment between the sensor 209 and the orifice 225 is possible because the notch 204 fixes the position of the sensor 209 relative to the PCB 200 and thus relative to the alignment rod orifice 206, because the position of the orifice 225 in the chemically inert member 222 is fixed relative to the alignment rod orifice 224, and because the alignment rod orifices 206, 224 are aligned with each other as shown.

Other techniques for aligning the orifice 224 and the sensor 209 are contemplated and included in the scope of this disclosure. For instance, the chemically inert member 222 may be larger than the PCB 200 such that it encases the PCB 200, and the lateral outer surfaces of the PCB 200 may be aligned with respect to the lateral inner surfaces of the chemically inert member 222 to cause alignment of the orifice 225 and the sensor 209. More specifically, if the lateral outer surfaces of the PCB 200 abut the lateral inner surfaces of the chemically inert member 222, and further, if the distance of the sensor 209 from the lateral outer surfaces of the PCB 200 is the same as the distance of the orifice 225 from the lateral outer surfaces of the chemically inert member 222, then the sensor 209 and the orifice 225 will be aligned. In such examples, the notch 204 is still useful to fix the position of the sensor 209 with respect to the lateral outer surfaces of the PCB 200.

In examples, the orifice 225 has a diameter that is large enough such that the sensor 209 is not covered by any portion of the chemically inert member 222. In examples, the chemically inert member 222 has a funnel shape leading to the orifice 225 to facilitate fluid flow toward the sensor 209. In examples, the chemically inert member 222 comprises PEEK or PTFE. In other examples, the chemically inert member 222 comprises a polymer, such as Perfluoroalkoxy alkane (PFA), Fluorinated ethylene propylene (FEP), Ethylene tetrafluoroethylene (ETFE), Polychlorotrifluoroethylene (PCTFE), Polyvinylidene fluoride (PVDF), polypropylene (PP), or polyimide (polyetherimide (ULTEM)). In examples, the chemically inert member 222 comprises a ceramic, such as silicon dioxide, aluminum oxide, or aluminum nitride, or metals such as titanium that may be machined or otherwise manufactured to form the chemically inert member 222.

FIG. 2D2 depicts a top-down view of the structure of FIG. 2D1. FIG. 2E1 depicts a cross-sectional view of the structure of FIG. 2D1, with the addition of alignment rods 226 (e.g., metal rods, PEEK rods) that extend through the alignment rod orifices 206, 224 as shown, thereby causing the chemically inert member 222 to be aligned with the structure of FIG. 2C1 as described above. In addition to the alignment techniques described above, proper alignment between the orifice 225 and the sensor 209 may be achieved in examples by choosing a suitable diameter of the alignment rod 226 relative to the diameters of the alignment rod orifices 206, 224. For instance, the diameter of the alignment rod 226 may be selected to minimize play within the alignment rod orifices 206, 224, thereby facilitating the desired alignment. In examples, the diameters of the alignment rod orifices 206, 224 are identical. In examples, the diameters of the alignment rod orifices 206, 224 differ by less than 10 microns, 100 microns, or 1 mm. In examples, the diameter of the alignment rod 226 differs from the smaller of the diameters of the alignment rod orifices 206, 224 by 10 microns, 100 microns, or 1 mm. In examples, the diameter of the alignment rod 226 is chosen to occupy the full diameter of the alignment rod orifices 206, 224, thus mitigating play in the alignment rod orifices 206, 224 and facilitating the desired alignment.

FIG. 2E1 also depicts a member 230 extending through the orifice 225 as shown. In examples, the member 230 is hollow, and in other examples, the member 230 is solid. In examples, the member 230 has a cylindrical shape. An o-ring seal 228 couples to and circumscribes the member 230 and is positioned between the chemically inert member 222 and the active surface 210. The member 230 facilitates proper alignment of the o-ring seal 228 with the sensor 209. Specifically, and using the techniques described above, the orifice 225 aligns with the sensor 209, and the member 230 is positioned inside the orifice 225, thereby aligning the member 230 with the sensor 209. Because the o-ring seal 228 circumscribes the member 230, the position of the member 230 with respect to the sensor 209 determines the position of the o-ring seal 228 with respect to the sensor 209. As with the alignment rod orifices 206, 224 and alignment rods 226, reducing play between the member 230 and the chemically inert member 222 at the orifice 225 stabilizes the member 230 and reduces the likelihood of misplacement of the o-ring seal 228 relative to the sensor 209. In examples, a gap between an outer surface of the member 230 and the chemically inert member 222 at the orifice 225 is 0 microns, less than 1 micron, less than 10 microns, less than 100 microns, and less than 1 mm. Other factors also may affect play of the member 230. For instance, the thickness of the chemically inert member 222 at the orifice 225 may affect play of the member 230. For example, if this thickness is too small, the member 230 may tilt at an angle, resulting in improper placement of the o-ring seal 228 with respect to the sensor 209. Accordingly, in examples, the thickness of the chemically inert member 222 at the orifice 225 is at least 1 micron, at least 10 microns, at least 100 microns, or at least 1 mm. Although the examples herein are described in the context of o-ring seals, other types of gasket seals may be substituted for o-ring seals in each of the examples described.

In examples, the o-ring seal 228 has a circular shape in a horizontal cross-section. In examples, the o-ring seal 228 comprises a non-conductive, chemically inert elastomer material such as ethylene propylene diene monomer (EPDM), fluoroelastomer (FKM), Perfluoroelastomers (FFKM), silicone, or thermoplastics such as Polytetrafluoroethylene (PTFE) or other thermoset elastomers. In examples, the o-ring seal 228 has a diameter that is large enough such that when the chemically inert member 222 makes contact with the PCB 200, the o-ring seal 228 is compressed between the chemically inert member 222 and the active surface 210. In examples, this compression may range between 10 and 40 percent of the thickness of the o-ring seal 228 in an uncompressed state. In examples, this compression is at least 25 percent of the thickness of the o-ring seal 228 in an uncompressed state. The degree of compression is not a mere design choice; rather, a greater compression of the o-ring seal 228 is advantageous because the o-ring shape becomes less round and thus better able to block fluid ingress, while a lesser compression is advantageous because the o-ring is not mechanically overstressed. In addition, non-round gasket or o-ring seal shapes may be advantageous depending on the specific application. FIG. 2E2 depicts a top-down view of the structure of FIG. 2E1.

Still referring to FIG. 1, the method 100 next includes coupling the chemically inert member to the PCB such that the o-ring seal circumscribing the second member is compressed between the chemically inert member and the semiconductor die, and such that the o-ring seal circumscribes the electrochemical sensor (110). The method 100 additionally includes positioning a mold compound between the chemically inert member, the PCB, and the o-ring seal (112). FIG. 2F1 depicts the same structures as FIG. 2E1, except that the chemically inert member 222 is coupled to the PCB 200 as shown. Coupling the chemically inert member 222 to the PCB 200 causes the chemically inert member 222 to compress the o-ring seal 228, which circumscribes the sensor 209. As explained above, the compression may be to any suitable degree, but in examples, the chemically inert member 222 compresses the o-ring seal 228 by 10 to 40 percent of the thickness of the o-ring seal 228 in an uncompressed state. In some examples, compressing the o-ring seal 228 is advantageous because such compression causes the o-ring seal 228 to create a leak-resistant or leak-free and pressure-proof seal between the o-ring seal 228 and the preferably flat semiconductor die 208 and chemically inert member 222 surfaces. The member 230 may then be removed, for example, by pulling the member 230 away from the chemically inert member 222 and the o-ring seal 228.

A mold compound 232 may be positioned between the chemically inert member 222, the PCB 200, the semiconductor die 208, and the o-ring seal 228. The mold compound 232 may be positioned in this area by, for example, injecting the mold compound through an orifice (not expressly depicted) that is machined through the body of the PCB 200. In examples, the mold compound 232 may be dispensed before coupling of the PCB 200 and the chemically inert member 222, and is allowed to spread during the compression, with excess mold compound exiting through an orifice (not expressly depicted). In examples, the mold compound has a viscosity ranging from 1000 centipoise (cP) to 300000 cP. FIG. 2F2 depicts a top-down view of the structure of FIG. 2F1.

Removing the member 230 results in the structure depicted in FIG. 2G1. The structure depicted in FIG. 2G1 is identical to that of FIG. 2F1, except that the member 230 is removed, thus exposing the sensor 209. In addition, the alignment rod orifices 206, 224 and alignment rods 226 may be removed using any suitable process. As explained above, the structure of FIG. 2G1 is not necessarily a complete fluid sensing package, meaning that other components may be included in the fluid sensing package of FIG. 2G1 that are not expressly depicted in FIG. 2G1. For example, metal traces and/or solder bumps may be provided in or on the PCB 200 to facilitate communication between the semiconductor die 208 and circuitry outside of the fluid sensing package. As such metallization is application-specific, it is omitted from FIG. 2G1 for clarity. Although these and other such components are not expressly depicted in FIG. 2G1, the structure of FIG. 2G1 is nevertheless referred to as a fluid sensing package because it contains components of a fluid sensing package.

In operation, fluid to be tested is applied to the sensor 209. The sensor 209 measures properties of the fluid and conveys electrical signals encoding those measured properties to other circuitry on the active surface of the semiconductor die 208, and/or to the PCB 200 via the bond wires 218. The aforementioned metallization in or on the PCB 200 then provides these electrical signals to the appropriate circuitry on or off the PCB 200 for further processing. The o-ring seal 228 prevents or mitigates undesirable fluid ingress to areas past the o-ring seal 228. In addition, the o-ring seal 228 prevents ion absorption, is able to withstand wide temperature variations, is chemically inert and thus does not negatively impact the accuracy of the sensor 209, adheres firmly to the active surface 210 and is mechanically robust, thus preserving and extending the life of the fluid sensing package.

FIG. 2G2 depicts a top-down view of the structure of FIG. 2G1. FIG. 2G3 depicts a perspective view of the structure of FIG. 2G1, except that the structure of FIG. 2G3 includes an external chemically inert, conformal casing 223 (e.g., parylene, PTFE, or atomic layer deposited (ALD) material) that covers the chemically inert member 222 and the PCB 200, leaving the sensor 209, as well as any solder bumps or conductive terminals coupled to the PCB 200, exposed. Alternatively, this casing can cover all conductive terminals if it is applied after the PCB is coupled to another electronic circuit that is to be covered by the conformal casing as well. This additional chemically inert casing may be beneficial because it may reduce the likelihood of interference with measurements by the sensor 209 and further because it protects the circuitry of the structure shown in FIG. 2G1 from exposure to fluids, heat, physical trauma, etc.

Figure 3A:
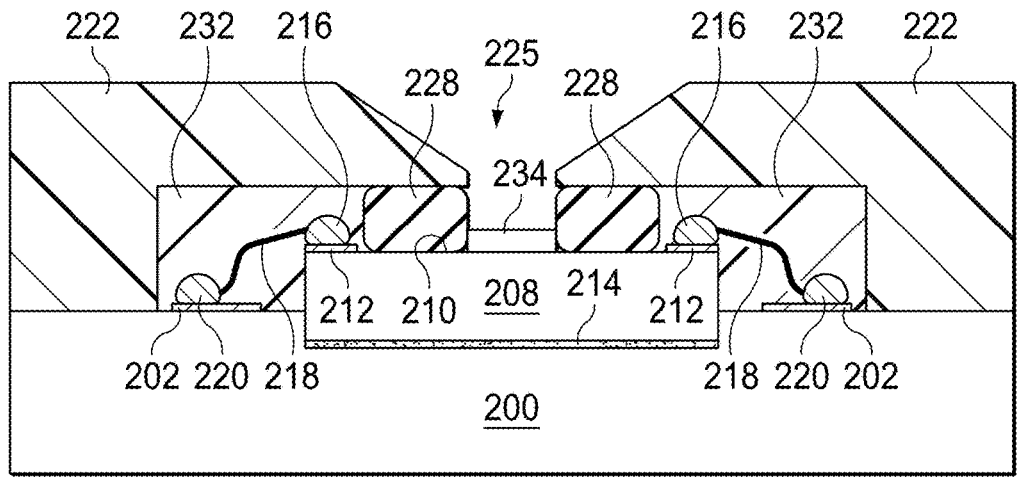
FIGS. 3A and 3B depict profile cross-sectional and top-down views, respectively, of an example fluid sensing package, in accordance with various examples.
Figure 3B:
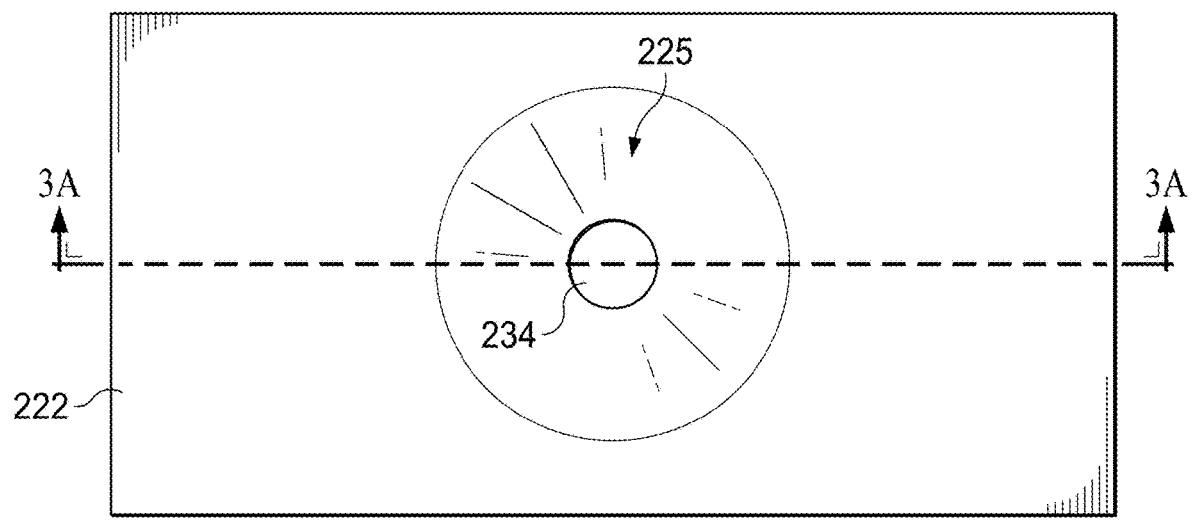

FIGS. 3A, 3B, and 4A-4C depict variations of the example of FIG. 2G1-2G3. In particular, FIG. 3A depicts the structure of FIG. 2G1, except that the structure of FIG. 3A additionally includes a protective cover 234 (e.g., a photoresist) positioned on and covering the sensor 209. The protective cover 234 may be applied, for example, after the circuitry is formed on the active surface 210 of the semiconductor die 208. In examples, the protective cover 234 is useful to align the o-ring seal 228 with respect to the sensor 209 so that the o-ring seal circumscribes the sensor 209. For example, if the protective cover 234 is covering the sensor 209, the o-ring seal 228 may be placed circumscribing the protective cover 234, which results in the o-ring seal 228 circumscribing the sensor 209. Accordingly, in examples implementing the protective cover 234, the aforementioned alignment rod orifices 206, 224 and the alignment rods 226 may be omitted. In such examples, the protective cover 234, if not sufficiently thick, is not useful in aligning the o-ring seal 228 with the sensor 209. Accordingly, in such examples, the protective cover has a minimum thickness of 10 microns, of 100 microns, and of 1 mm. The protective cover 234 may be removed after the structure shown in FIG. 3A has been assembled. FIG. 3B depicts a top-down view of the structure of FIG. 3A.

Figure 4A:
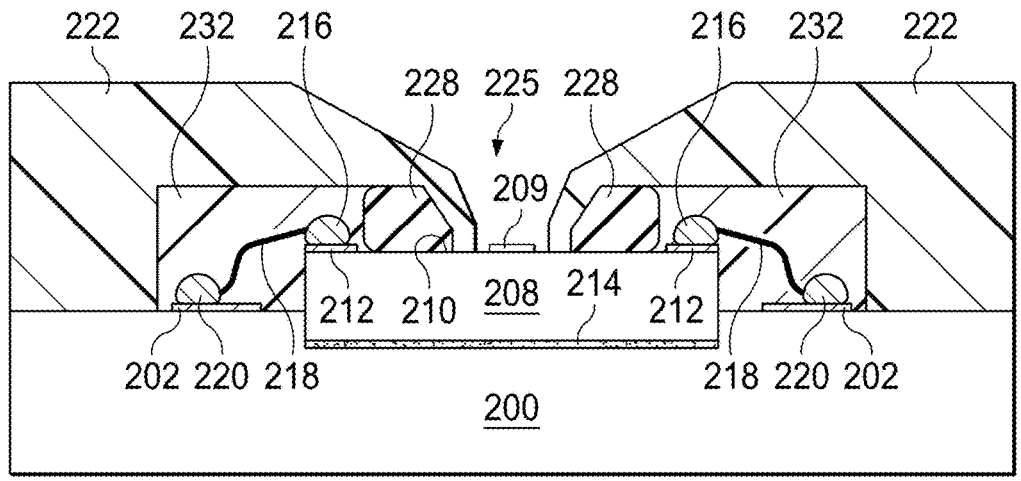
FIGS. 4A, 4B, and 4C depict profile cross-sectional, top-down, and perspective views, respectively, of an example fluid sensing package in accordance with various examples.
Figure 4B:
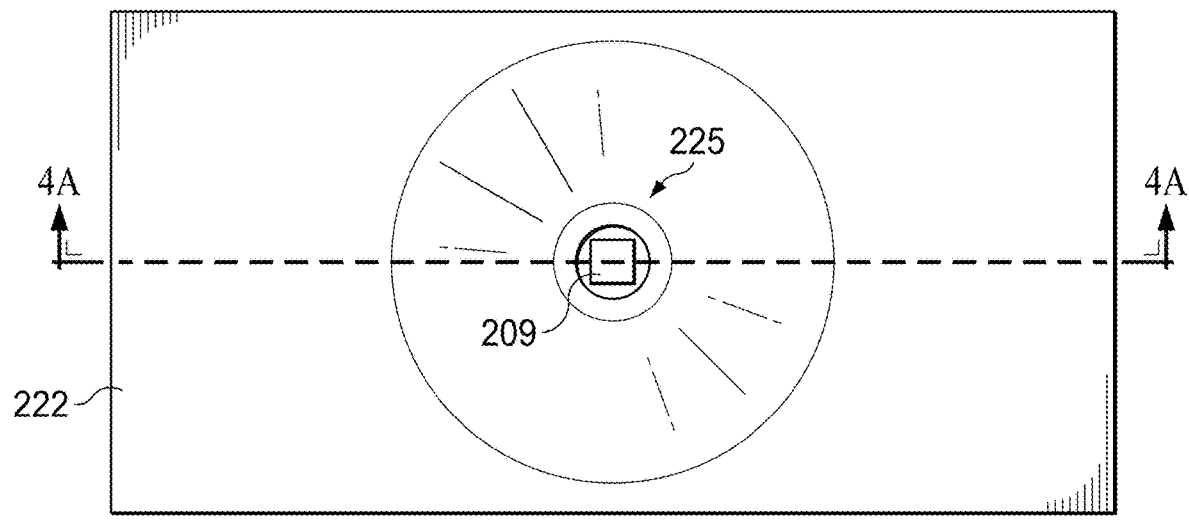
Figure 4C:
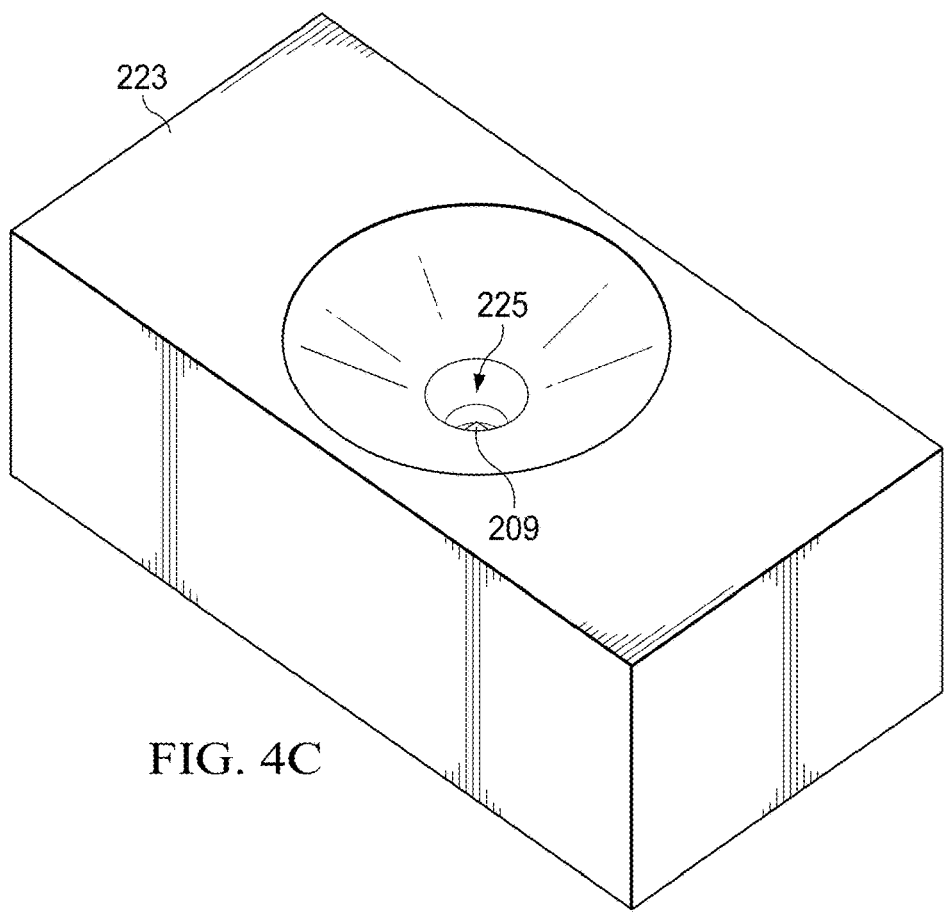

FIG. 4A depicts a structure that is identical to that of FIG. 2G1, except that the chemically inert member 222 of FIG. 4A has a different shape (as shown) than that of the chemically inert member 222 of FIG. 2G1. The shape of the chemically inert member 222 of FIG. 4A may be such that the o-ring seal 228 is not in direct contact with the fluid to be tested. In examples, the shape of the chemically inert member 222 may be such that turbulence is minimized in a flow profile of the fluid across the sensor 209. Other shapes for the chemically inert member 222 are contemplated and included within the scope of this disclosure. The shape of the chemically inert member of FIG. 4A facilitates fluid flow toward and away from the sensor 209 during operation. FIG. 4B depicts a top-down view of the structure of FIG. 4A. FIG. 4C depicts a perspective view of the structure of FIG. 4A within an optional casing 223 (e.g., a PEEK casing).

Figure 5:
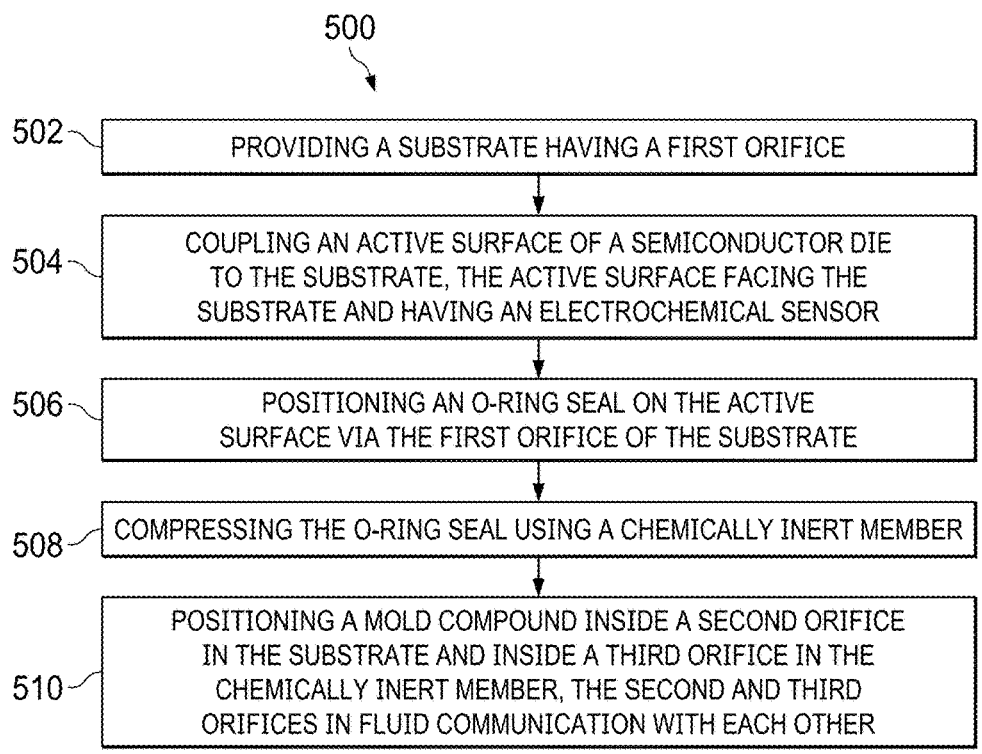
FIG. 5 is a flow diagram of a method for manufacturing an illustrative fluid sensing package, in accordance with various examples.

FIG. 5 is a flow diagram of a method 500 for manufacturing an illustrative fluid sensing package, in accordance with various examples. FIGS. 6A1-6C3 depict profile cross-sectional, top-down, and perspective views of a process flow for manufacturing an illustrative fluid sensing package, in accordance with various examples. The method 500 may be used to implement the process flow of FIGS. 6A1-6C3. Accordingly, FIGS. 5 and 6A1-6C3 are now described in parallel.

The method 500 begins by providing a substrate having a first orifice (502). FIG. 6A1 depicts a substrate 600, such as a PCB. Although any suitable material may be used for a substrate 600, a PCB is assumed for purposes of this description. The PCB 600 includes orifices 621 that extend through the thickness of the PCB 600. In addition, the PCB 600 includes an orifice 607 (e.g., the aforementioned "first orifice" of step 502) that extends through a thickness of the PCB 600.

The method 500 then comprises coupling an active surface of a semiconductor die to the substrate, the active surface facing the substrate and having an electrochemical sensor (504). As FIG. 6A1 depicts, bond pads 612 on an active surface 610 of a semiconductor die 608 couple to the PCB 600 via conductive terminals 614 (e.g., flip-chip techniques such as solder bumps, or anisotropic conductive film with coined gold stud bumps or electroless nickel or gold plating on the bond pads 612). Because the active surface 610 faces the PCB 600, the example of FIG. 6A1 may be described as a flip chip example. The active surface 610 includes a sensor 609, such as an electrochemical sensor. In examples, the active surface 610 includes other circuitry as well.

The method 500 then comprises positioning an o-ring seal on the active surface via the first orifice of the substrate (506). As FIG. 6A1 depicts, an o-ring seal 628 is positioned on the active surface 610 and circumscribes the sensor 609. In examples, the o-ring seal 628 has one or more characteristics of the o-ring seal 228 described above. In examples, the outer diameter of the o-ring seal 628 is equivalent to the distance between the conductive terminals 614 depicted in FIG. 6A1, which is equivalent to the diameter of the orifice 607. In examples, the conductive terminals 614 are separated from each other by a distance of the diameter of the orifice 607 plus 100 microns to 900 microns. Accordingly, the orifice 607 and/or the conductive terminals 614 may be used to align the o-ring seal 628 as desired with respect to the sensor 609 and other circuitry or metallization that may be present on the active surface 610. For example, the orifice 607 and/or the conductive terminals 614 may be used to cause the o-ring seal 628 to circumscribe the sensor 609. To achieve such alignment, the spacing between an outermost surface of the o-ring seal 628 and the PCB 600, for example, may be 0 microns or no more than 1 micron, no more than 10 microns, no more than 100 microns, or no more than 1 mm. Excessive spacing between the outermost surface of the o-ring seal 628 and the PCB 600 may result in suboptimal placement of the o-ring seal 628, for instance, directly on or covering part of the sensor 609. Cornerbonds or edgebonds 636 may optionally be included to provide additional mechanical support to the structure. FIG. 6A2 depicts a top-down view of the structure of FIG. 6A1.

The method 500 then comprises compressing the o-ring seal using a chemically inert member (508). FIG. 6B1 depicts the structure of FIG. 6A1, except with the addition of a chemically inert member 622 coupled to the PCB 600. The chemically inert member 622 includes orifices 623, which, in examples, may be horizontal orifices. When the chemically inert member 622 and the PCB 600 are coupled, the orifices 621 and the orifices 623 come into fluid contact with each other, as shown. In examples, the orifices 623 are orthogonal relative to the orifices 621. The chemically inert member 622 also includes an orifice 625. The shape of the chemically inert member 622, and particularly, the orifice 625, may vary as desired to facilitate or impede fluid flow toward and away from the sensor 609. When the chemically inert member 622 is coupled to the PCB 600, the portions of the chemically inert member 622 that form the orifice 625 compress the o-ring seal 628 against the active surface 610 of the semiconductor die 608. The degree to which the o-ring seal 628 is compressed may vary as desired, although in some examples, the o-ring seal 628 is compressed by 10 to 40 percent of the thickness of the o-ring seal 628 in an uncompressed state, and in some examples, the o-ring seal 628 is compressed by at least 25 percent of the thickness of the o-ring seal 628 in an uncompressed state. Compressing the o-ring seal 628 to a greater or lesser degree may result in the advantages and/or disadvantages described above. In examples, the chemically inert member 622 has the same or similar composition as the chemically inert member 222 described above. FIG. 6B2 depicts a top-down view of the structure of FIG. 6B1.

The method 500 subsequently comprises positioning a mold compound inside a second orifice in the substrate and inside a third orifice in the chemically inert member that is in fluid communication with the second orifice of the substrate (510). As used herein, fluid communication between two features means that the features are arranged relative to each other in such a way that a fluid or gas could flow from one feature to the other, although a fluid or gas need not actually flow between the features. FIG. 6C1 depicts the structure of FIG. 6B1 rotated by 180 degrees (e.g., turned upside down) to facilitate the positioning of a mold compound 638 inside the orifices 621, 623, as well as on the surface of the PCB 600 that faces the semiconductor die 608. The mold compound 638 covers the orifices 621, the conductive terminals 614, and portions of the semiconductor die 608 to create a void-free underfill in proximity to the bond pads 612, which prevents or mitigates humidity-related failures that may occur as a result of such voids. When positioned inside the orifices 621, 623, the mold compound 638 couples the PCB 600 and the chemically inert member 622 together. Accordingly, in examples, an axis 639 that extends through a center of the o-ring seal 628 also extends through a center of the orifice 625.

FIG. 6C2 depicts a top-down view of the structure of FIG. 6C1. FIG. 6C3 depicts a perspective view of the structure of FIG. 6C1, but rotated by 180 degrees and covered by an optional, chemically inert, conformal casing 627, such as Parylene, PTFE, or an atomic layer deposited (ALD) material casing, leaving the sensor 609 and any solder bumps or conductive terminals (not expressly depicted) coupled to the PCB 600 exposed. Such a chemically inert casing is beneficial because it reduces the likelihood of interference with measurements by the sensor 609 and further because it protects the circuitry of the structure shown in FIG. 6C1 from exposure to fluids, heat, physical trauma, etc. As explained above, FIGS. 6C1-6C3 depict a fluid sensing package, although not all components (e.g., application-specific components such as metallization in or on the PCB 600 and solder bumps on the PCB 600) of the package are expressly depicted to preserve clarity.

Referring to FIGS. 6C1-6C3, in operation, fluid to be tested is applied to the sensor 609. The sensor 609 measures properties associated with the fluid to be tested and provides electrical signals encoding the measured properties to other circuitry, such as circuitry on the active surface 610 of the semiconductor die 608. The electrical signals are subsequently provided to metallization in or on the PCB 600 via the conductive terminals 614, and the PCB 600 may provide the signals to other circuitry either on or off the PCB 600 via the metallization, solder bumps, etc. The o-ring seal 628 prevents or mitigates undesirable fluid ingress to areas past the o-ring seal 628. In addition, the o-ring seal 628 prevents ion absorption, is able to withstand wide pressure and temperature variations, is chemically inert and thus does not negatively impact the accuracy of the sensor 609, adheres firmly to the active surface 610 and is mechanically robust, thus preserving and extending the life of the fluid sensing package.

FIGS. 7A1-7A3, 7B1-7B3, 8A, and 8B depict variations of the example shown in FIGS. 6C1-6C3. In particular, FIG. 7A1 depicts the same structure as FIGS. 6C1-6C3, except that the shape of the chemically inert member 622 differs from that of the chemically inert member 622 in FIGS. 6C1-6C3. Specifically, the chemically inert member 622 of FIG. 7A1 includes a fluid inlet port 750 and a fluid inlet 752 in fluid communication with the fluid inlet port 750. The fluid inlet 752 extends from the fluid inlet port 750 to a surface 754 of the chemically inert member 622 that abuts the o-ring seal 628. The chemically inert member 622 of FIG. 7A1 also comprises a fluid outlet port 758 and a fluid outlet 756 in fluid communication with the fluid outlet port 758. The fluid outlet 756 extends from the surface 754 to the fluid outlet port 758. Fluid to be tested may flow through the fluid inlet port 750, the fluid inlet 752, onto the sensor 609, through the fluid outlet 756, and through the fluid outlet port 758. In examples, peripheral attachments may be inserted into the fluid inlet port 750 and fluid outlet port 758 to facilitate the flow of fluid into and out of the fluid inlet 752 and fluid outlet 756, respectively. Such attachments are described in U.S. patent application Ser. No. 16/572,303, which was filed on Sep. 16, 2019, is entitled "Manufacturing Fluid Sensing Packages," and is incorporated herein by reference in its entirety. Examples of such attachments are depicted in FIG. 7A4, which shows screw inlet port 780 positioned inside fluid inlet port 750 and screw outlet port 782 positioned inside fluid outlet port 758. Tube 784 couples to screw inlet port 780 and tube 786 couples to screw outlet port 782. Tube 784 carries fluid to the fluid inlet 752, and the tube 786 carries fluid away from fluid outlet 756.

FIG. 7A1 also depicts solder bumps (or balls) 760, which, in some examples, facilitate communication between the PCB 600 and another electronic device (e.g., another PCB) to which the solder bumps 760 may couple. Such bumps may also be used in any of the other examples described herein as may be appropriate. FIG. 7A2 depicts a top-down view of the structure of FIG. 7A1. FIG. 7A3 depicts a perspective view of the structure of FIG. 7A1, except that the structure of FIG. 7A3 depicts a chemically inert casing 759 (e.g., PEEK, PTI-E) covering the PCB 600. Such a chemically inert casing provides the advantages described above with respect to, e.g., FIG. 2G3.

FIG. 7B1 depicts the same structure as FIGS. 6C1-6C3, except that the shape of the chemically inert member 622 differs from that of the chemically inert member 622 in FIGS. 6C1-6C3. Specifically, the chemically inert member 622 of FIG. 7B1 includes a cavity 761 that is adapted to store fluid to be tested. For example, fluid to be tested may be poured into the cavity 761 of the chemically inert member 622, and as the fluid sits in the cavity 761, the sensor 609 measures properties of the fluid. An optional lid (not expressly depicted) may be used to cover the cavity 761 while the sensor 609 performs the measurements, for example, to prevent evaporation. As with the examples described above, the o-ring seal 628 prevents or mitigates undesirable fluid ingress to areas beyond the o-ring seal 628, and the o-ring seal 628 has the numerous advantages described above. FIG. 7B2 depicts a top-down view of the structure of FIG. 7B1, and FIG. 7B3 depicts a perspective view of the structure of FIG. 7B1. As with other perspective view drawings described above, FIG. 7B3 includes a chemically inert casing 759 that covers structures such as the PCB 600 and the semiconductor die 608, leaving the sensor 609 and portions of the solder bumps 760 exposed. The chemically inert casing 759 provides the benefits described above with respect to, e.g., FIG. 2G3.

Figure 8A:
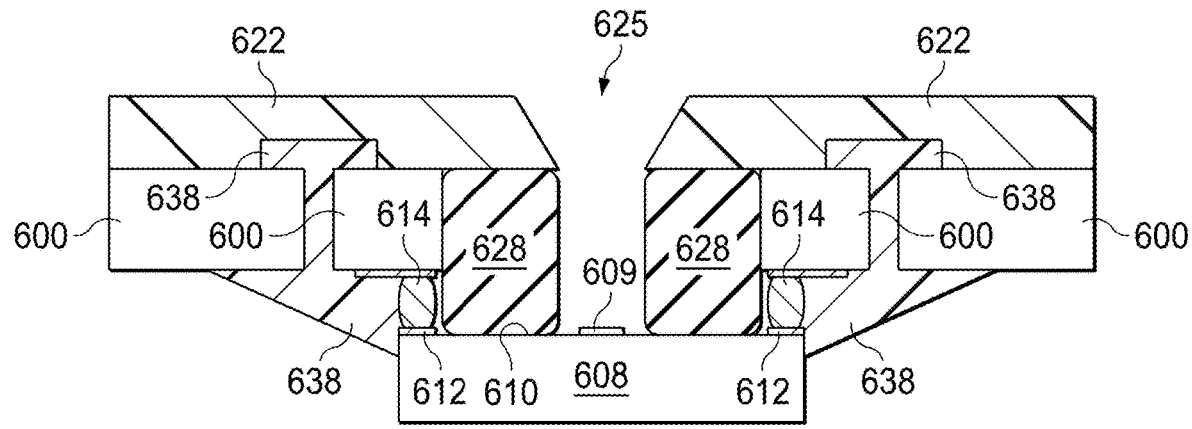
FIGS. 8A and 8B depict profile cross-sectional and top-down views, respectively, of an illustrative fluid sensing package, in accordance with various examples.
Figure 8B:
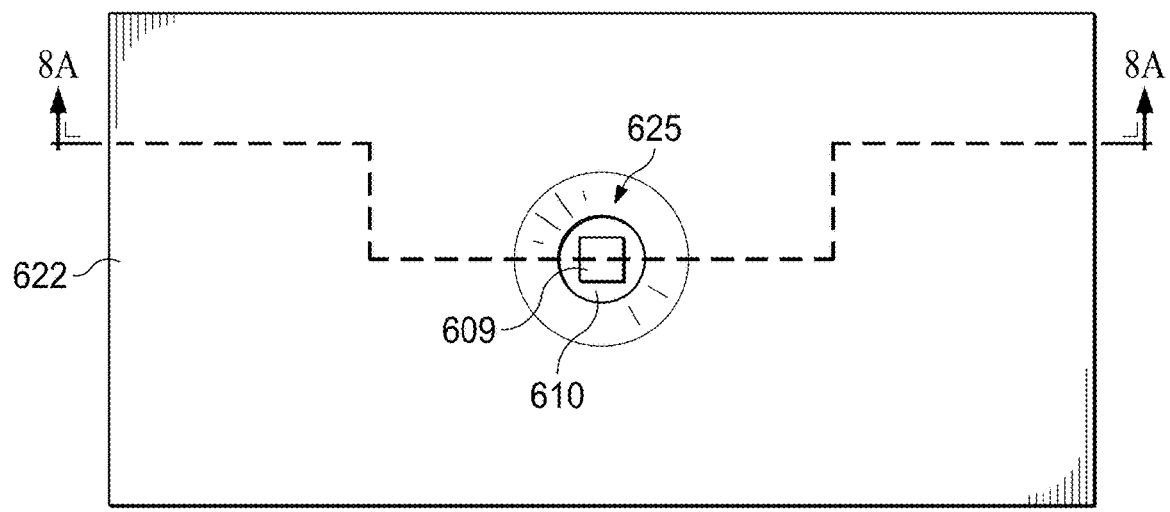

FIG. 8A depicts the same structure as that shown in FIGS. 6C1-6C3, except that the structure of FIG. 8A includes an o-ring seal 628 that is substantially thicker than that shown in FIGS. 6C1-6C3. Compressing the o-ring seal 628 by a particular degree (e.g., compressing the o-ring seal 628 so that its compressed thickness is 60 to 90 percent of its uncompressed thickness; compressing the o-ring seal 628 so that its compressed thickness is no more than 75 percent of its uncompressed thickness) may achieve the objectives for the o-ring seal described above, regardless of the original or compressed thickness of the o-ring seal 628. Accordingly, a thicker o-ring seal 628 facilitates the use of a chemically inert member 622 that has a simpler and easier-to-manufacture shape, as shown in FIG. 8A. Specifically, the chemically inert member 622 of FIG. 8A does not include a portion that extends downward into the orifice 625, as does the chemically inert member 622 of FIG. 6C1. Accordingly, the thicker o-ring seal 628 (e.g., an o-ring seal 628 that extends from the active surface 610 of the semiconductor die 608 to a horizontal plane that coincides with a top surface of the PCB 600, as shown) results in a simpler, less expensive, and easier-to-manufacture shape for the chemically inert member 622. In some examples, multiple (e.g., two, three, four, or more) o-ring seals 628 may be stacked, and this stack may be used in lieu of a single o-ring seal 628. Such a stack may be useful, for example, when each o-ring seal 628 in the stack is not adequately thick on its own to achieve an adequate seal with the shape of the chemically inert member 622 as shown. FIG. 8B depicts a top-down view of the structure of FIG. 8A.

FIG. 9 is a flow diagram of a method 900 for manufacturing an illustrative fluid sensing package, in accordance with various examples. FIGS. 10A1-10C2 depict cross-sectional and top-down views of illustrative fluid sensing packages, in accordance with various examples. The method 900 may be used to manufacture the structures of FIGS. 10A1-10C2. Accordingly, FIGS. 9 and 10A1-10C2 are now described in parallel.

The method 900 begins by providing a substrate having an orifice (902). FIG. 10A1 depicts a substrate 1000, which may comprise any suitable material but which is assumed to be a PCB for this description. The PCB 1000 includes an orifice 1007 which may be formed, for example, using a CNC machining process. The method 900 subsequently includes coupling an active surface of a semiconductor die to the substrate, the active surface having an electrochemical sensor (904). FIG. 10A1 depicts the semiconductor die 608 having an electrochemical sensor 609 positioned an active surface 610 that couples to the PCB 600 via bond pads 612 and conductive terminals 614.

The method 900 comprises positioning an o-ring seal between the substrate and the active surface such that the o-ring seal circumscribes the electrochemical sensor and such that the o-ring seal is compressed (906). As FIG. 10A1 depicts, an o-ring seal 628 may be forced into the area between the PCB 1000 and the active surface 610, thus causing the o-ring seal 628 to circumscribe the sensor 609 and such that the o-ring seal 628 is compressed (e.g., compressed by 10 to 40 percent of the thickness of the o-ring seal 628 in an uncompressed state; compressed by at least 25 percent of the thickness of the o-ring seal 628 in an uncompressed state). In other examples, rather than forcing the o-ring seal 628 into the area between the PCB 1000 and the active surface 610, the o-ring seal 628 may be positioned prior to the PCB 1000 being coupled to the semiconductor die 608. In such cases, however, the o-ring seal 628 should be composed of a material (e.g., Perfluoroelastomers) that is able to withstand the heat associated with flip chip bonding and subsequent interconnect forming processes (e.g., reflow processes), such as when the conductive terminals 614 are coupled to the bond pads 612. An axis 1009 extends through a center of the o-ring seal 628 and a center of the orifice 1007. FIG. 10A2 depicts a top-down view of the structure of FIG. 10A1. The structure of FIGS. 10A1 and 10A2 omits a chemically inert member that is separate from the PCB 1000. Instead, in examples, the PCB 1000 is itself chemically inert, and thus a separate chemically inert member (e.g., a PEEK or PTFE member) is not used. As with the various structures described above, the structure of FIGS. 10A1 and 10A2 may be described as a fluid sensing package, notwithstanding the fact that some components (e.g., application-specific metallizations in or on the PCB 1000) are omitted for clarity. The operation of the fluid sensing package shown in FIGS. 10A1 and 10A2 is similar to the operation of the fluid sensing packages described above.

FIG. 10B1 depicts a variation of the example fluid sensing package shown in FIG. 10A1. In particular, the structure of FIG. 10B1 is identical to that of FIG. 10A1, except that the PCB 1000 includes a notch 1010. The presence of a notch 1010 facilitates the use of a thicker o-ring seal 628 when a thinner o-ring seal 628 is unavailable. For example, if the notch 1010 were not present, a thinner o-ring seal 628 would be needed, but if such a thinner o-ring seal 628 is unavailable, the notch 1010 accommodates a thicker o-ring seal 628 that may be available. The structure of FIG. 10B1 is a fluid sensing package, although some application-specific components (e.g., metallization in or on the PCB 1000) are omitted. The operation of the fluid sensing package shown in FIG. 10B1 is similar to the operation of the fluid sensing packages described above. FIG. 10B2 is a top-down view of the structure of FIG. 10B1.

Several of the drawings described above omit certain application-specific features, such as PCB metallization, for purposes of clarity. FIG. 10C1, however, depicts a simplified, example metallization that may be used in a fluid sensing package. Specifically, FIG. 10C1 depicts the structure of FIG. 10A1, except that the PCB 1000 includes conductive members 1012 and 1014, electrode 1016, and solder bumps (or balls) 760. The conductive members 1012 are positioned on a surface of the PCB 1000 that faces the semiconductor die 608. The conductive member 1014 is positioned in a body of the PCB 1000, for example, in a via that is machined into the PCB 1000. The electrode 1016 is positioned on a surface of the PCB 1000 that opposes the semiconductor die 608. The conductive member 1012 may carry electrical signals between the conductive terminals 614 and the solder bumps 760. The solder bumps 760 provide signals to or receive signals from the electrical component to which the solder bumps 760 are coupled. The conductive member 1014 carries electrical signals between the conductive member 1012 and the electrode 1016. The electrode 1016 may be, e.g., an electrochemical electrode that is exposed to the fluid to be tested, such as a working electrode for voltammetry or for impedance spectroscopy. Hence, the electrode may be made from a material such as gold, platinum, or titanium, which can withstand exposure to potentially aggressive fluids. FIG. 10C2 depicts a top-down view of the structure of FIG. 10C1.

Figure 11A:
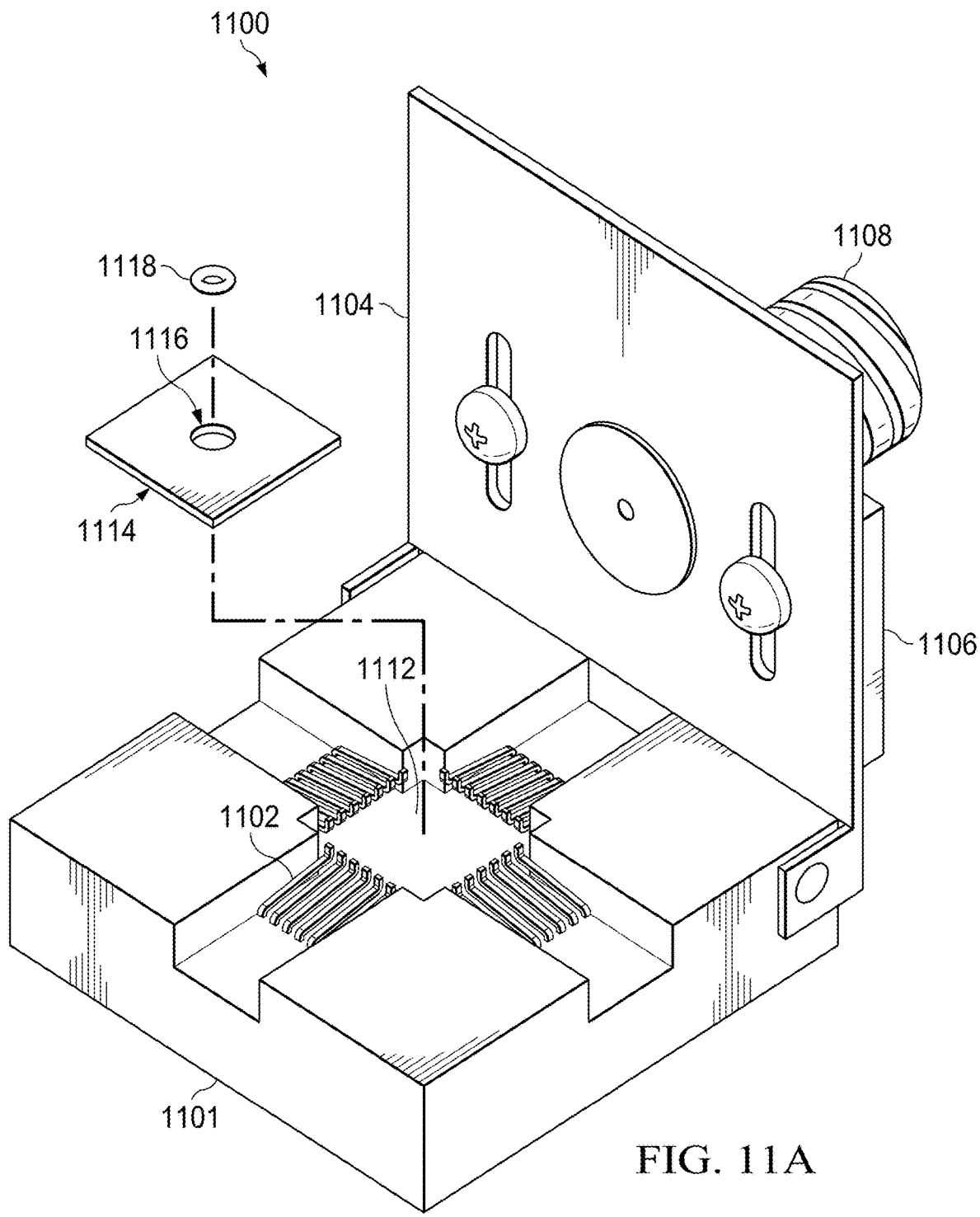
FIGS. 11A-11H depict perspective, profile cross-sectional, and top-down views of a fluid testing assembly, in accordance with various examples.

FIGS. 11A-11H depict perspective, profile cross-sectional, and top-down views of a fluid testing assembly, in accordance with various examples. The fluid testing assembly may be useful to perform short-term (e.g., less than one week of continuous testing) fluid tests, or to perform quality assurance testing of fluid sensors (e.g., the sensor 609 described above). FIG. 11A depicts a fluid testing assembly 1100 comprising a test socket 1101 and a socket lid 1104 rotatably coupled to the test socket 1101. The test socket 1101 includes a pedestal 1112 that is circumscribed by arrays of conductive terminals 1102 (e.g., a row of conductive terminals 1102 is positioned on each of the four sides of the pedestal 1112). The conductive terminals 1102 extend through the body of the socket 1101 to a bottom surface of the socket 1101 for coupling to another electronic device, such as a test board, on which the fluid testing assembly 1100 may be mounted. The socket lid 1104 includes a plate 1106 and a chamber 1108 mounted on the plate 1106. To prepare for testing, a fluid sensing package 1114 having an orifice 1116 in which a sensor (e.g., electrochemical sensor;

not expressly depicted) is positioned on the pedestal 1112. The bottom of the fluid sensing package 1114 may include conductive terminals, such as solder bumps or balls, pins, etc. that couple the conductive terminals 1102 of the test socket 1101 to the sensor in the fluid sensing package 1114.

Figure 11B:
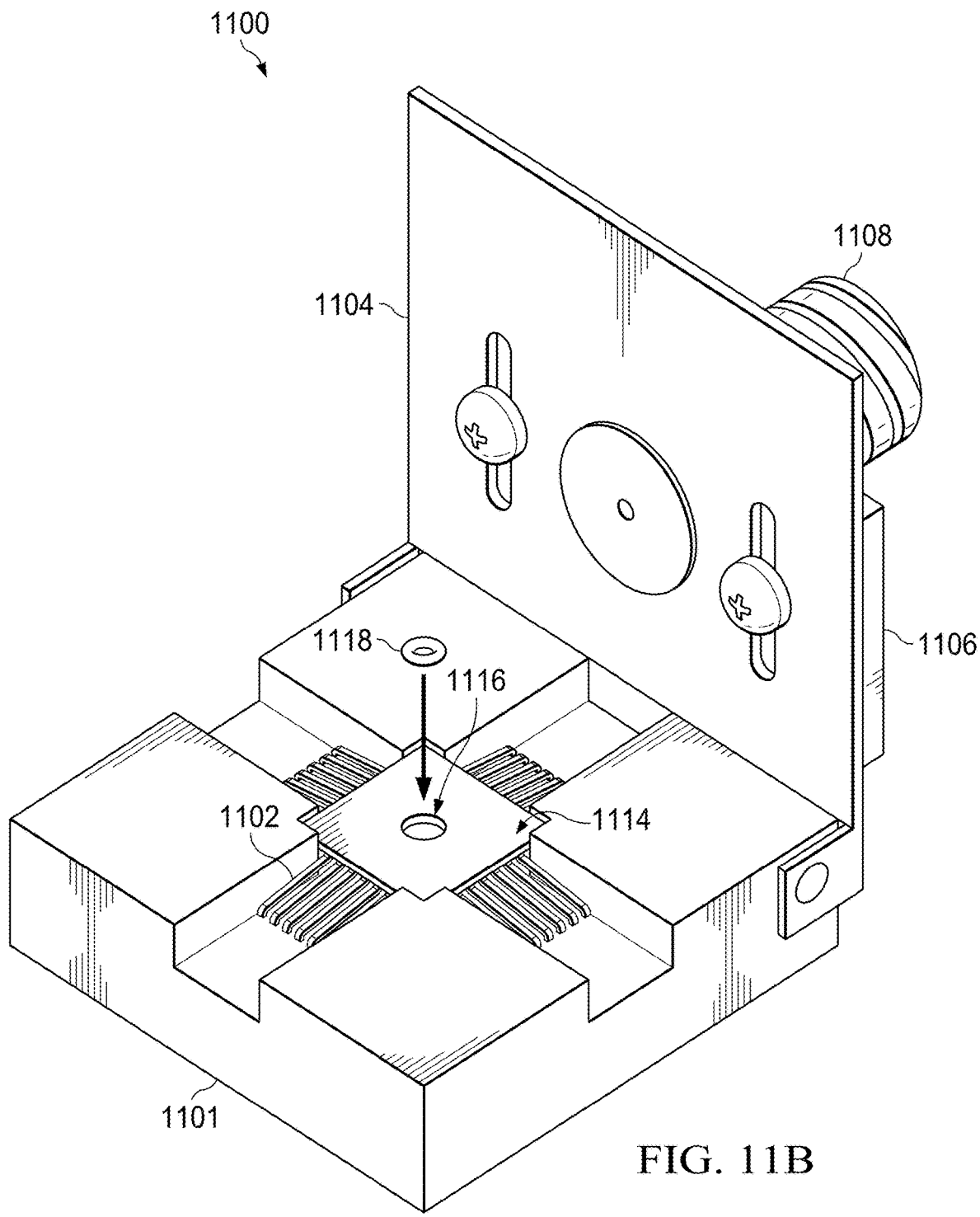
Figure 11C:
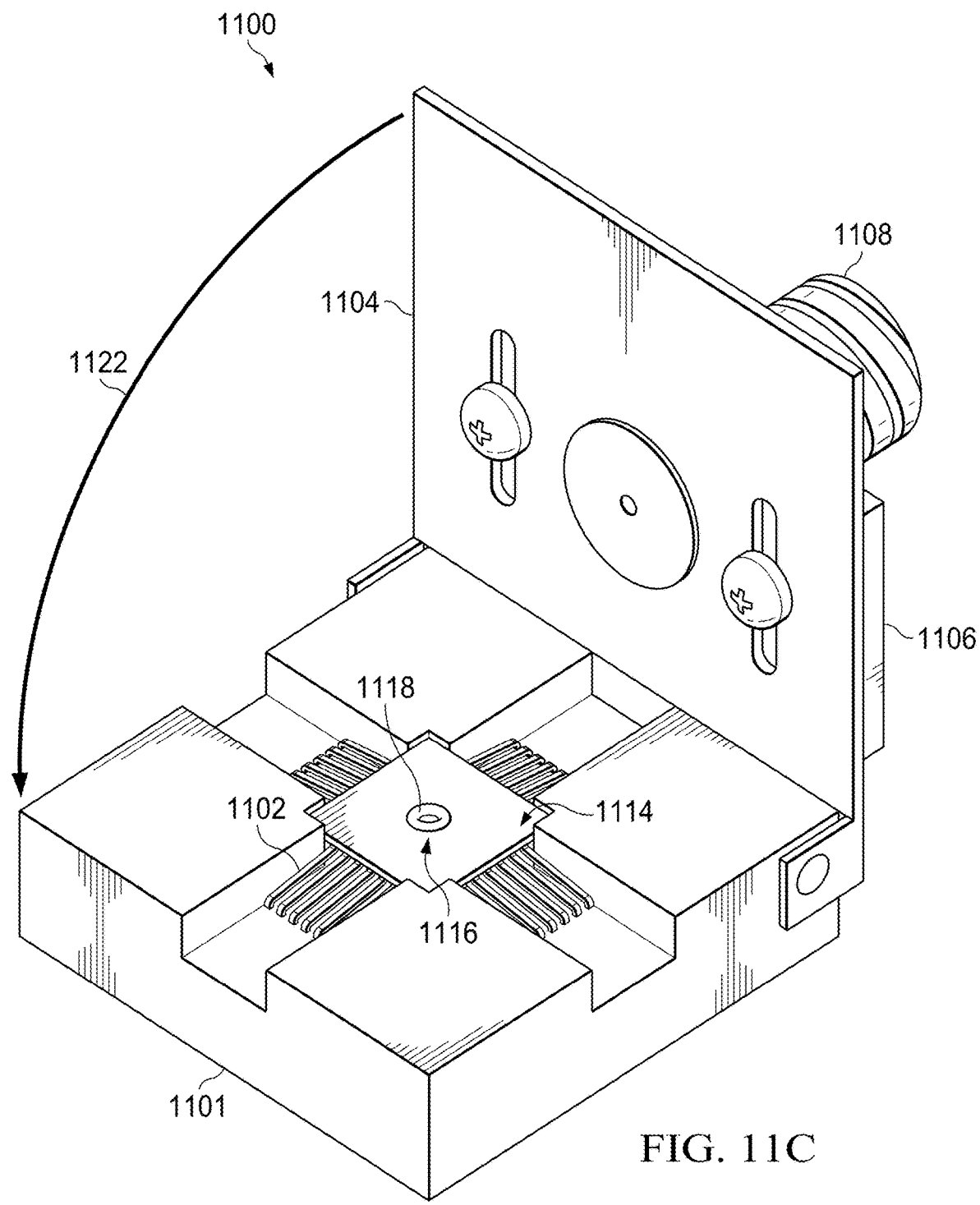
Figure 11D:
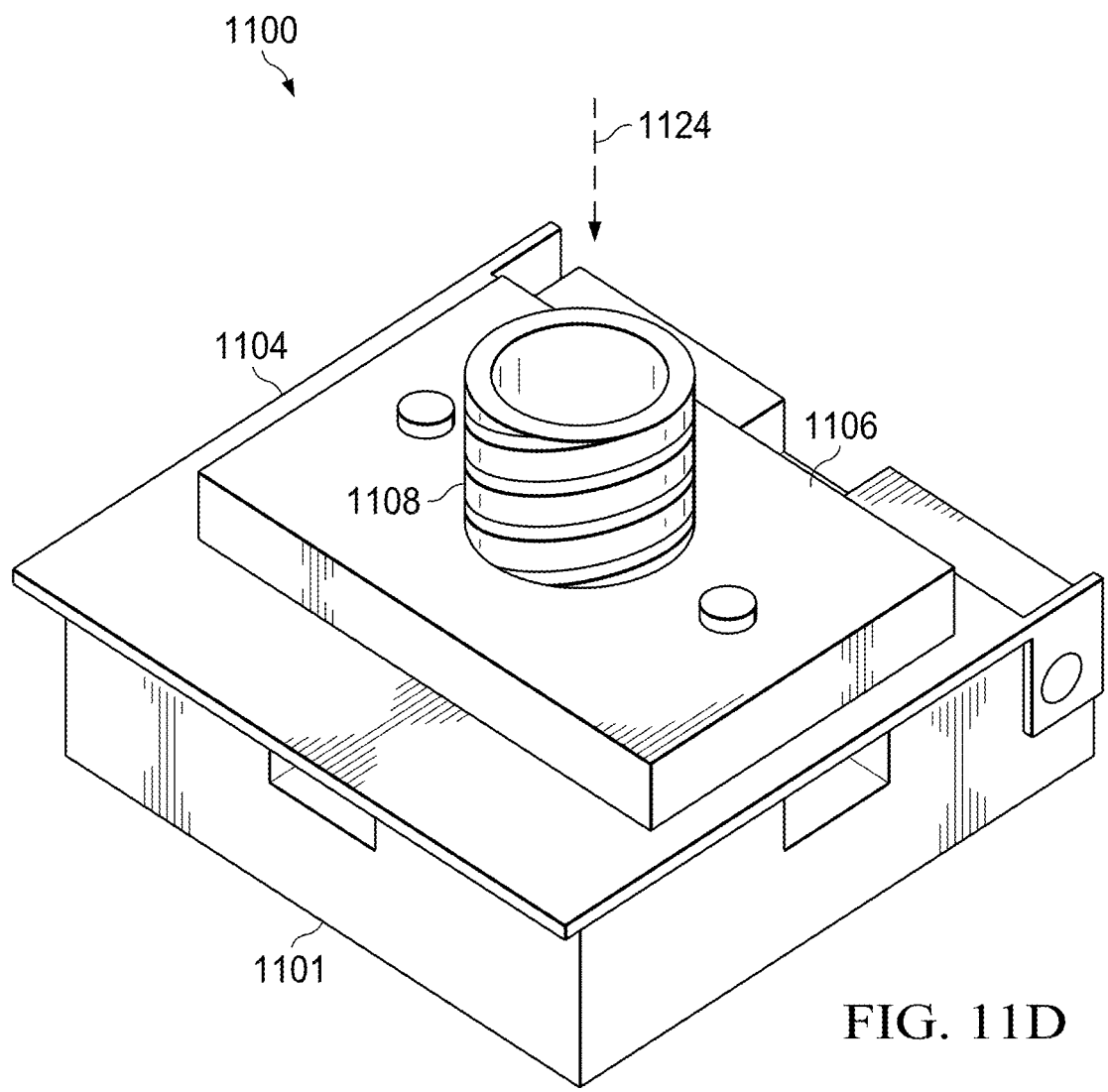
Figure 11E:
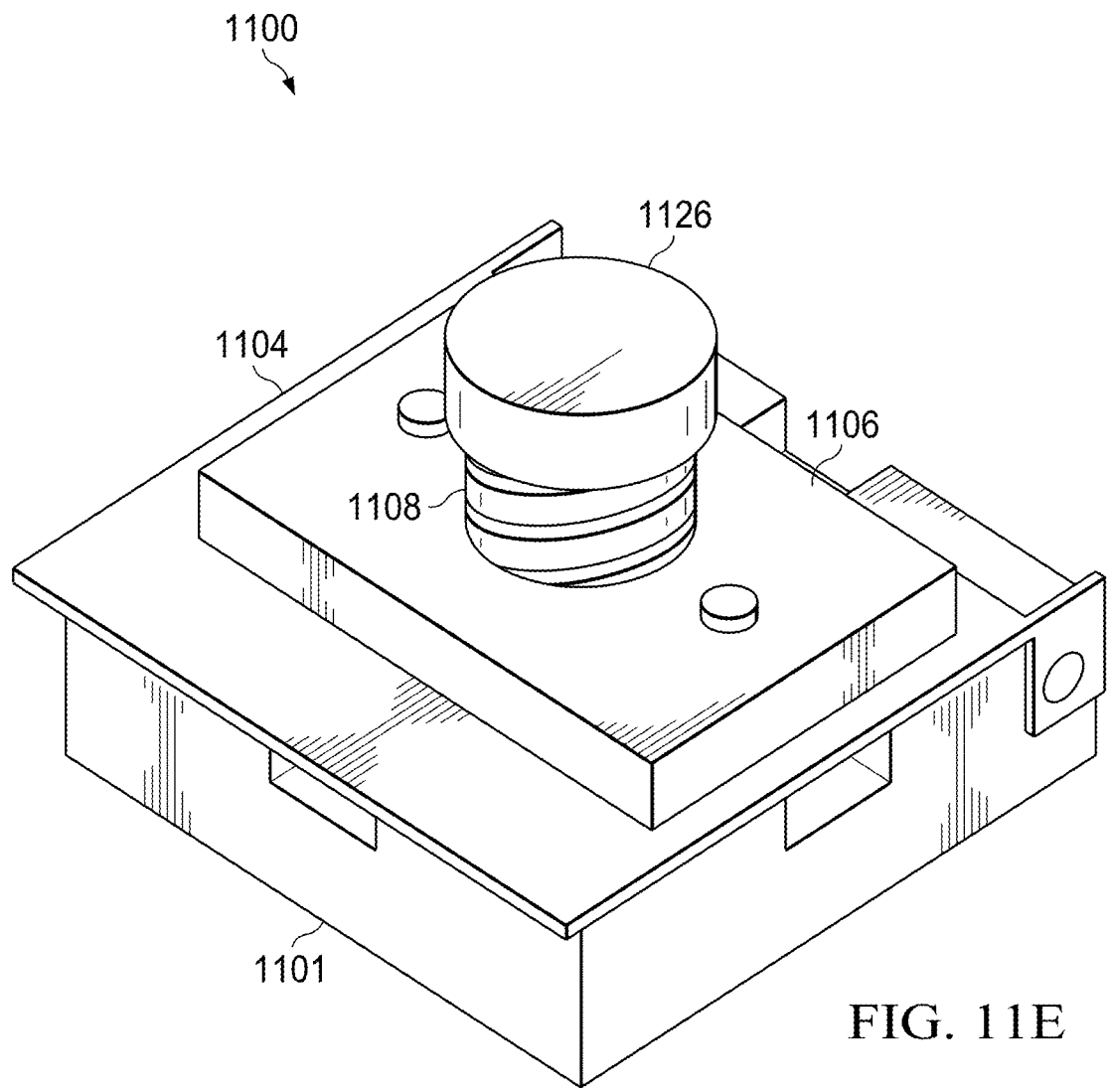

In examples, the package 1114 includes an o-ring seal such as those described above, and in other examples, the package 1114 lacks such an o-ring seal. In the example of FIGS. 11A-11H, the package 1114 lacks such an o-ring seal, but the package 1114 has a structure that permits the manual insertion of an o-ring seal 1118 into the package (e.g., into the orifice 1116) prior to testing, such as in FIGS. 10A1-10C2. As FIG. 11B depicts, the package 1114 is positioned on the pedestal 1112, and the o-ring seal 1118 is positioned inside the package 1114 such that the o-ring seal 1118 circumscribes a sensor (not expressly depicted) in the package 1114. In examples, the o-ring seal 1118 has the same or similar characteristics as the o-ring seals described above. As FIG. 11C depicts with numeral 1122, the socket lid 1104 is then closed. FIG. 11D depicts the filling of chamber 1108 with fluid, as arrow 1124 indicates. FIG. 11E depicts a cap 1126 sealing the top of the chamber 1108 to prevent evaporation or contamination of the fluid. The fluid may then be tested using the sensor. In other examples, a fluid with known properties may be used to test the sensor.

Figure 11F:
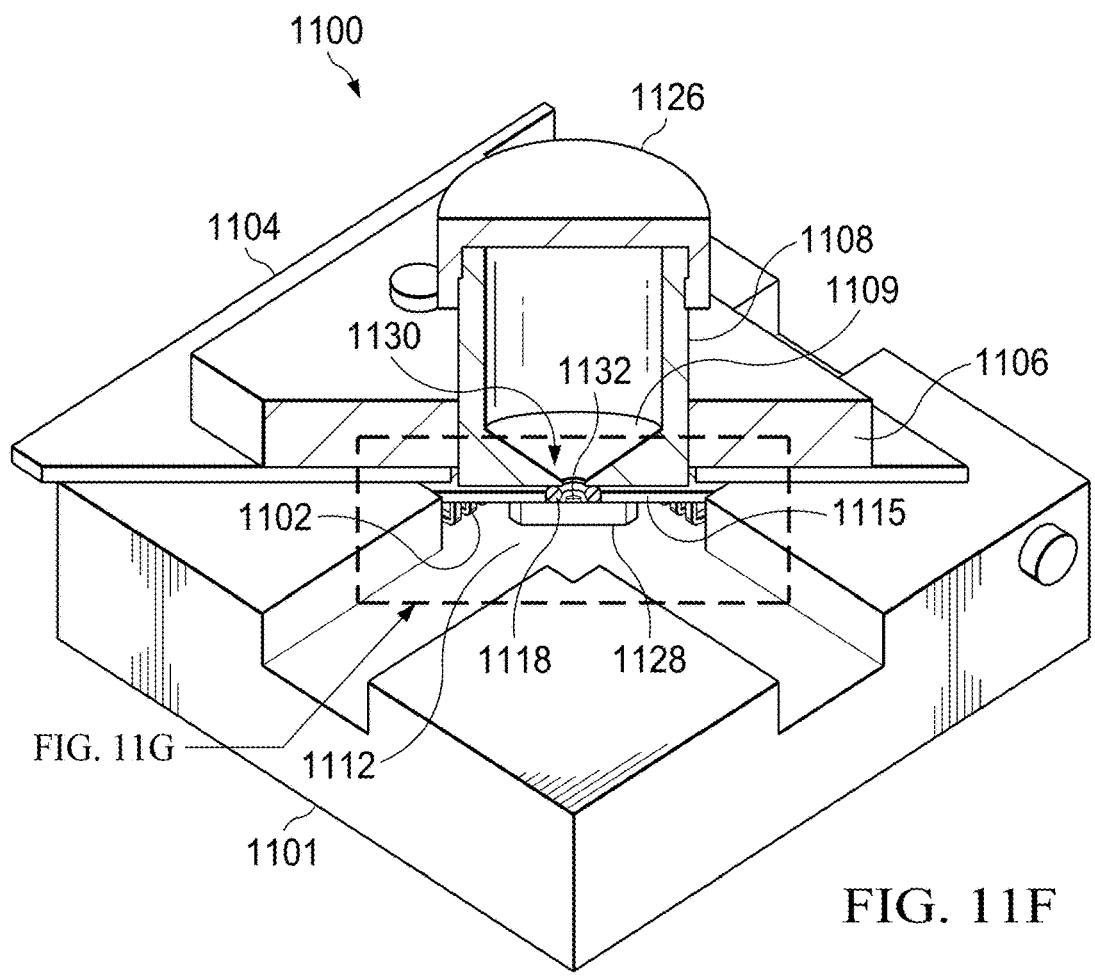
Figure 11G:
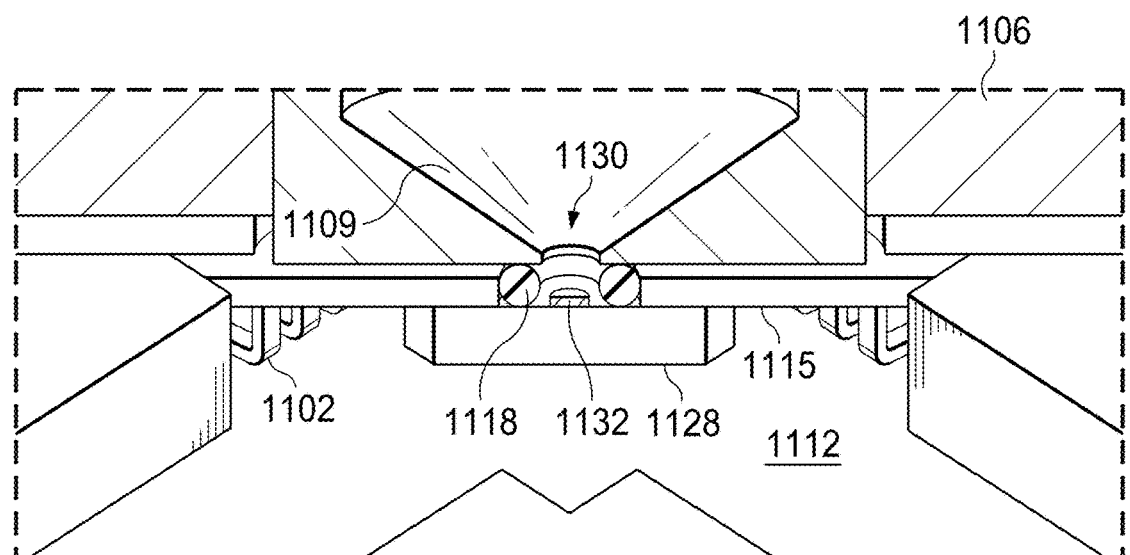

FIG. 11F depicts a cross-sectional perspective view of the fluid testing assembly 1100. As shown, the chamber 1108 includes a funnel portion 1109 to facilitate the flow of fluid from the chamber 1108 toward the sensor. FIG. 11G provides a detailed view of the interface between the chamber 1108 and the sensor. Specifically, FIG. 11G shows an orifice 1130 at the bottom of the funnel portion 1109. The fluid sensing package 1114 includes a substrate 1115 (e.g., a PCB), a semiconductor die 1128, a sensor 1132 positioned on an active surface of the semiconductor die 1128, and the o-ring seal 1118 positioned on the active surface of the semiconductor die 1128 and circumscribing the sensor 1132. The o-ring seal 1118 may have the characteristics of the o-ring seals described above and may prevent or mitigate undesirable fluid ingress in the same way and to the same degree as the o-ring seals described above. Conductive terminals of the substrate 1115 (not visible in this view) couple to the conductive terminals 1102 of the test socket 1101.

Figure 11H:
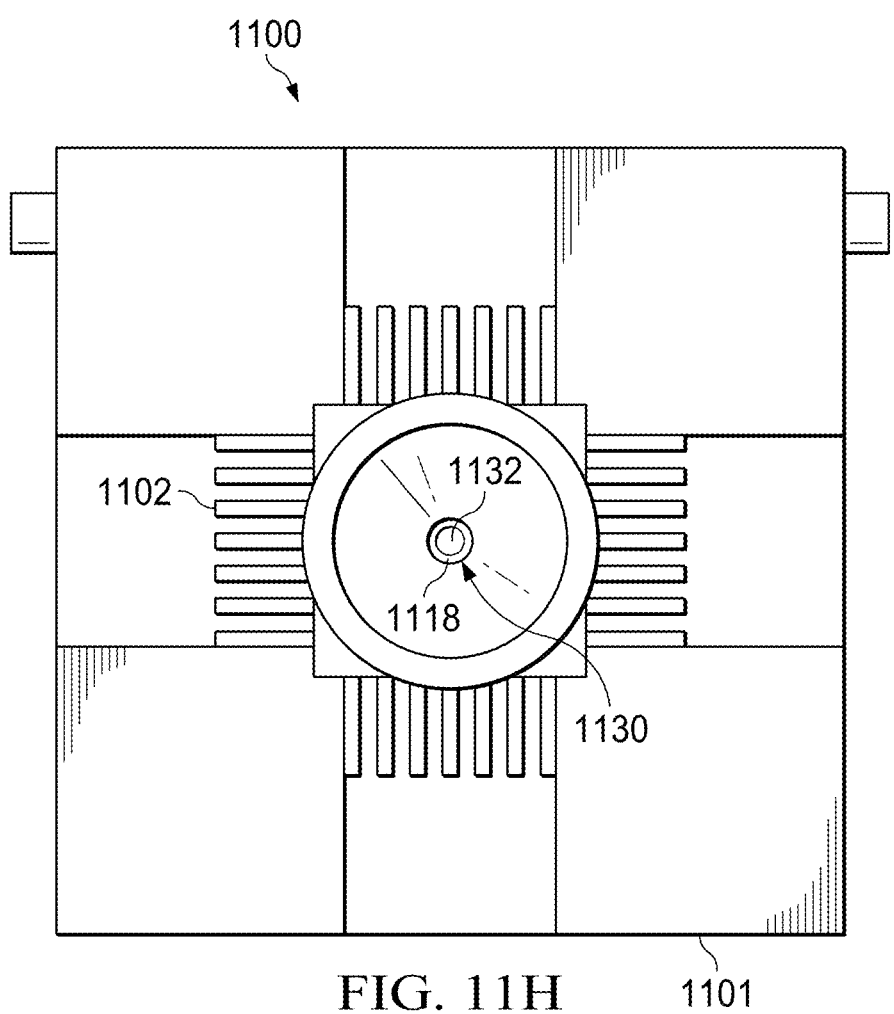

In operation, fluid passes through the orifice 1130 and onto the sensor 1132. The o-ring seal 1118 prevents undesirable fluid ingress to other areas beyond the o-ring seal 1118. Fluid measurements taken by the sensor 1132 are encoded into electrical signals that are provided to circuitry on the semiconductor die 1128, then to metallization on the substrate 1115, and then to conductive terminals 1102. From the conductive terminals 1102, the signals are provided to an electronic device (e.g., a PCB test board) on which the fluid testing assembly 1100 is mounted. FIG. 11H depicts a top-down view of a portion of the fluid testing assembly 1100, and more specifically, a top-down view toward the orifice 1130, the o-ring seal 1118, and the sensor 1132. A fluid testing assembly that is similar in some respects to the fluid testing assembly 1100 is described in U.S. patent application Ser. No. 16/572,303, which was filed on Sep. 16, 2019, is entitled "Manufacturing Fluid Sensing Packages," and is incorporated herein by reference in its entirety.

FIGS. 12A-12D depict profile cross-sectional, top-down, and perspective views of an illustrative fluid sensing package, in accordance with various examples. In particular, FIGS. 12A-12D depict a fluid sensing package with multiple sensors, at least two sensors positioned on opposing surfaces of the fluid sensing package. In examples, the fluid sensing package of FIGS. 12A-12D is a battery-powered, wireless fluid sensing package, meaning that the package contains, e.g., a wireless transmitter to transmit measurements obtained by the sensors to an electronic device located outside of the fluid sensing package. In examples, the fluid sensing package is assembled by forming two structures as described in the various examples above, and then coupling the two structures together to form a fluid sensing package with sensors on opposing surfaces of the fluid sensing package.

Figure 12A:
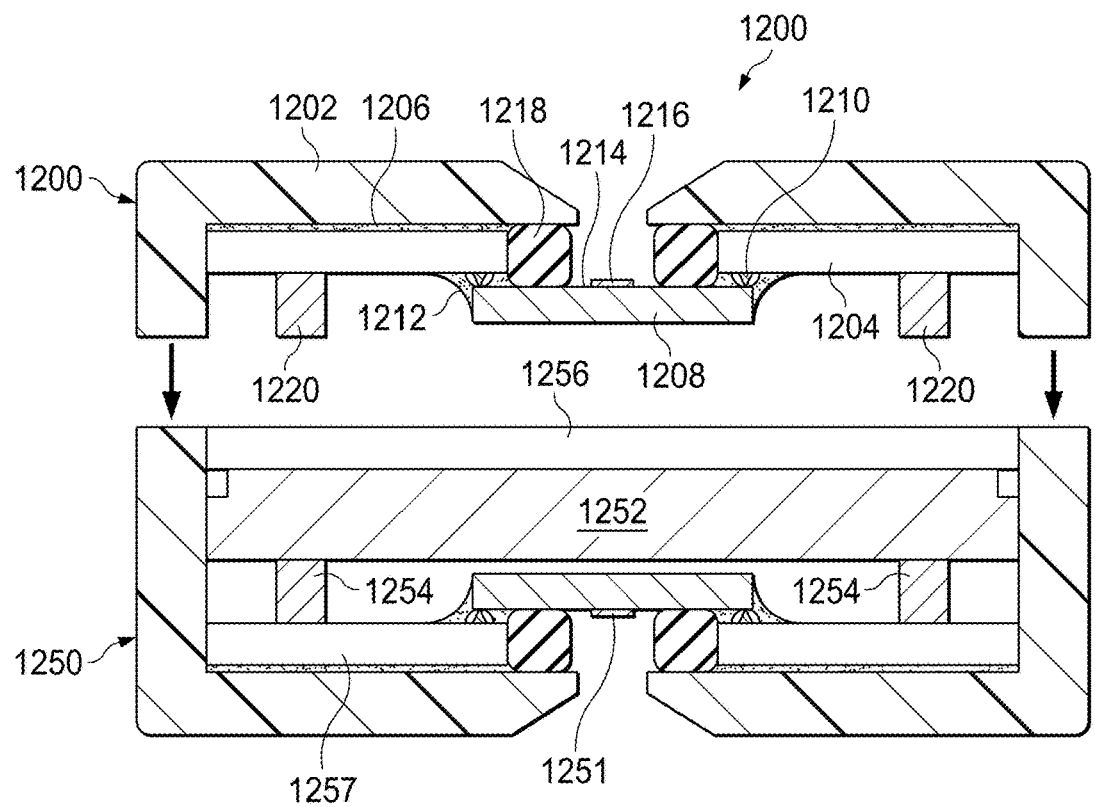
FIGS. 12A-12D depict profile cross-sectional, top-down, and perspective views of an illustrative fluid sensing package, in accordance with various examples.
Figure 12B:
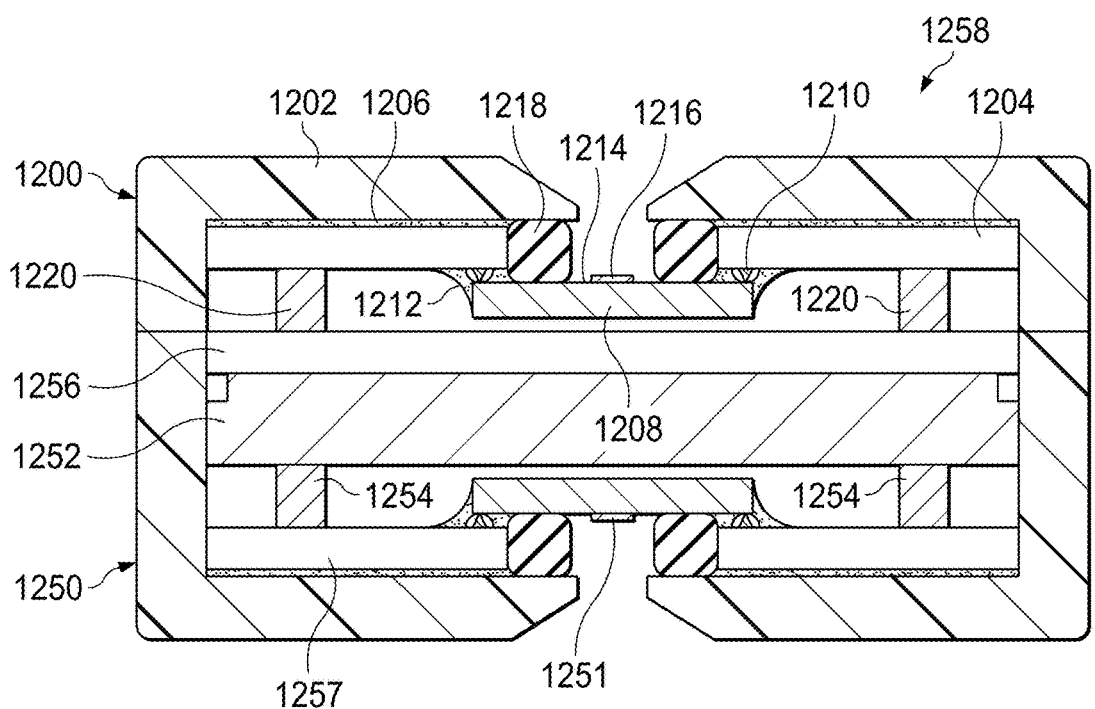
Figure 12C:
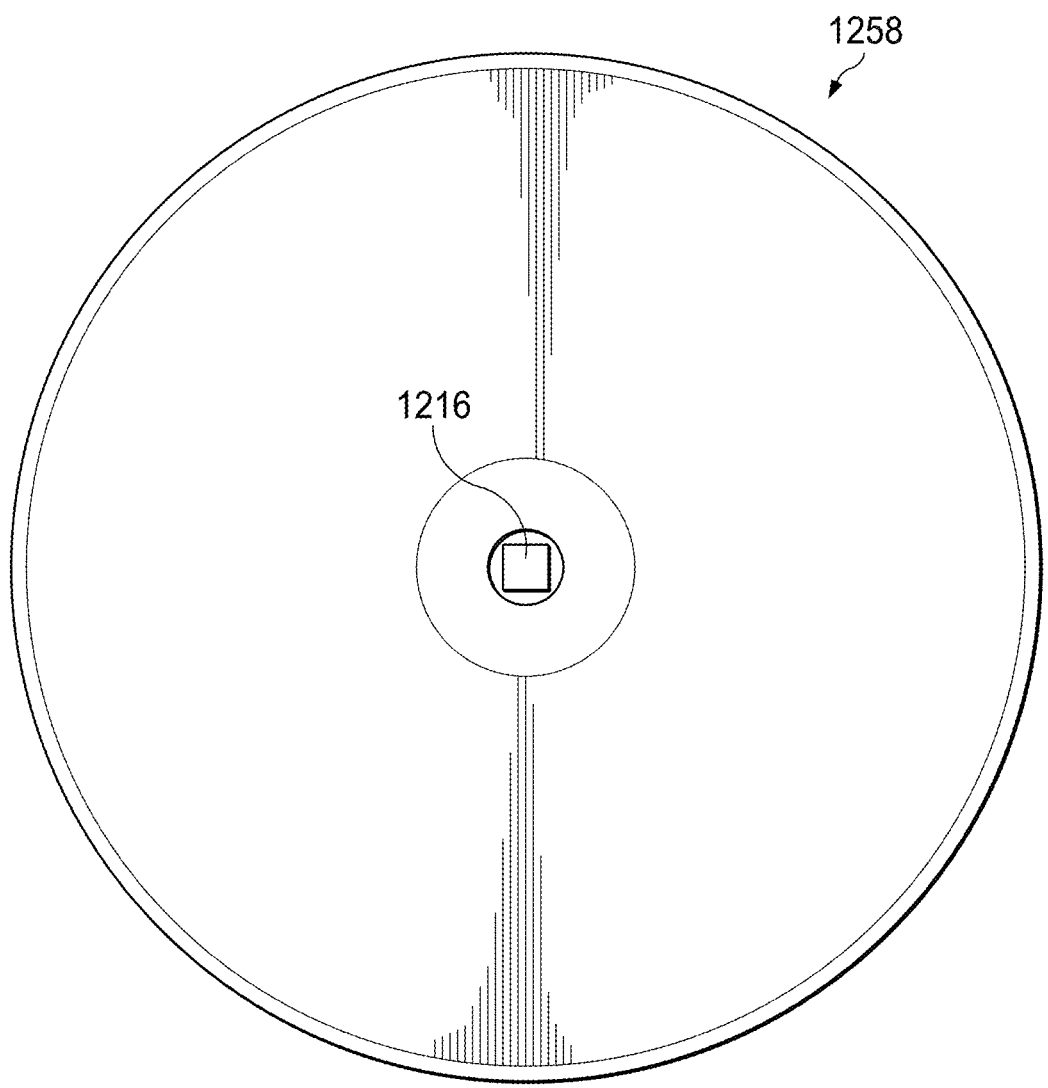
Figure 12D:
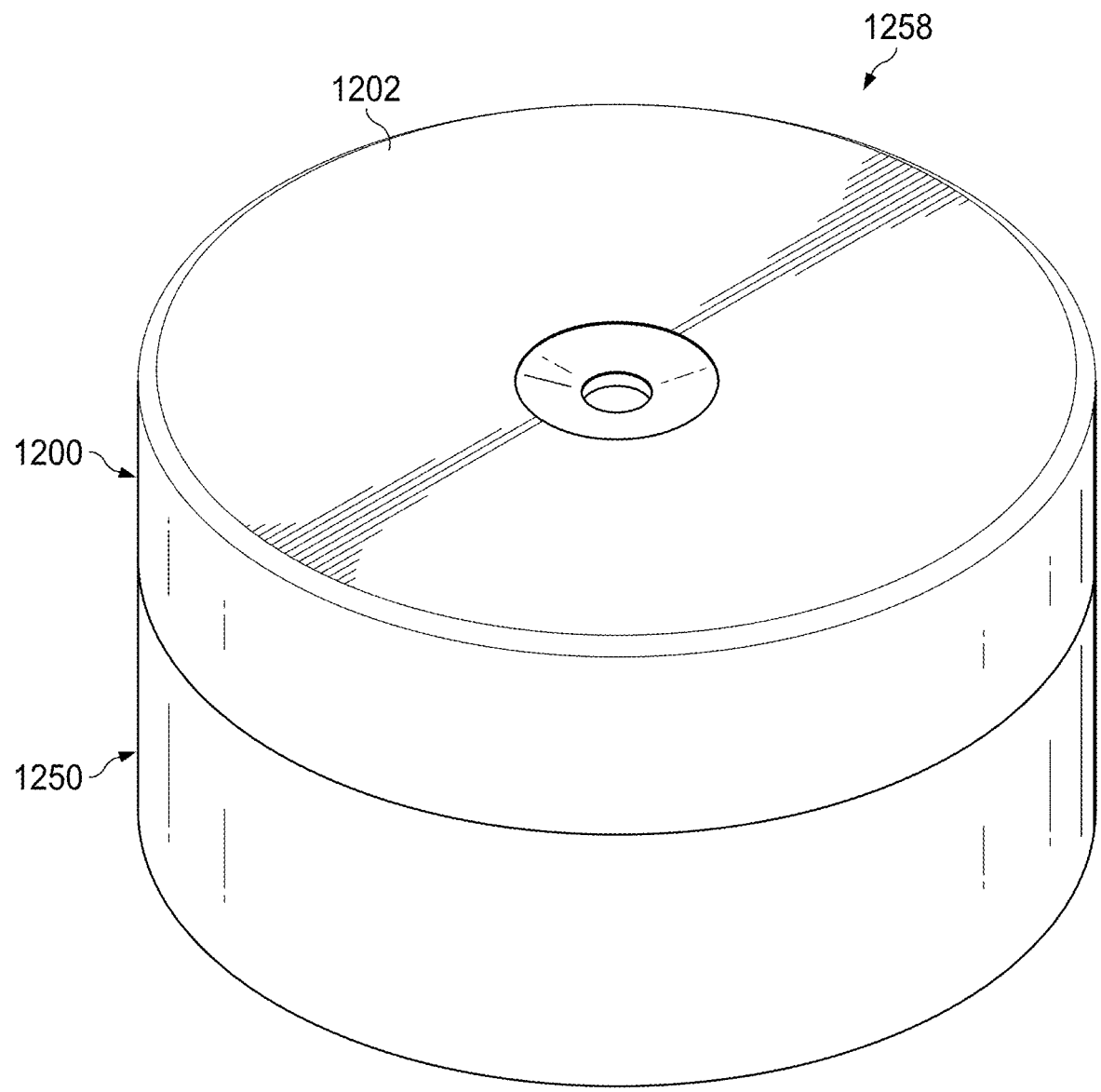

FIG. 12A depicts a profile, cross-sectional view of two structures 1200, 1250. In examples, each of the structures 1200, 1250 may be any of the various structures described above. In examples, each of the structures 1200, 1250 is formed using any of the various techniques described above. The example structure 1200 comprises a chemically inert member 1202 (e.g., PEEK) coupled to a substrate 1204 (e.g., PCB 1204) using mold compound 1206. A semiconductor die 1208 is coupled to the PCB 1204 using metal bumps 1210 (e.g., gold bumps). Mold compound 1212 covers the metal bumps 1210. The semiconductor die 1208 includes an active surface 1214 having a sensor 1216. An o-ring seal 1218 is positioned on the active surface 1214 and circumscribes the sensor 1216. Conductive terminals 1220 (e.g., solder bumps, edge connectors, wires, flex cables, surface mount device connectors) couple to the PCB 1204 as shown. The structure 1250 is formed similarly to the structure 1200 and includes a sensor 1251, except that the structure 1257 is coupled to a battery 1252 at solder bumps 1254, and the battery 1252 couples to a PCB 1256 as shown. FIG. 12B depicts the structures 1200, 1250 coupled to each other to form a fluid sensing package 1258, for example, using any suitable adhesive (e.g., welding or mold compound). FIG. 12C shows a top-down view of the fluid sensing package 1258, and FIG. 12D shows a perspective view of the fluid sensing package 1258. As shown, the sensors 1216, 1251 are positioned on opposing sides of the fluid sensing package 1258.

Numerous examples with differing features are described above with respect to the drawings. This disclosure encompasses examples in which these different features of the examples expressly described above are combined. The features may be combined in any suitable manner and in any suitable number.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. Unless otherwise stated, "about," "approximately," or "substantially" preceding a value means +/−10 percent of the stated value.

The above discussion is meant to be illustrative of the principles and various examples of the present disclosure.

Numerous variations and modifications will become apparent to those skilled in the art once the above disclosure is fully appreciated. It is intended that the following claims be interpreted to embrace all such variations and modifications.

What is claimed is:

1. A method, comprising:
   providing a substrate including a notch formed in a surface of the substrate;
   positioning a semiconductor die in the notch, the semiconductor die including an electrochemical sensor positioned on an active surface of the semiconductor die;
   coupling a bond wire to the substrate and to the active surface of the semiconductor die;
   providing a chemically inert member including an orifice formed therein and a second member extending through the orifice of the chemically inert member, an o-ring seal circumscribing the second member;
   coupling the chemically inert member to the substrate such that the o-ring seal circumscribing the second member is compressed between the chemically inert member and the semiconductor die and such that the o-ring seal circumscribes the electrochemical sensor, a position of the o-ring seal determined by the second member and as a result of positioning the semiconductor die in the notch;
   positioning a mold compound between the chemically inert member, the substrate, and the o-ring seal; and
   removing the second member after positioning the mold compound between the chemically inert member, the substrate, and the o-ring seal.

2. The method of claim 1, wherein the o-ring seal is positioned between the chemically inert member and the semiconductor die such that the chemically inert member does not make contact with the active surface of the semiconductor die.

3. The method of claim 1, wherein the chemically inert member abuts the active surface of the semiconductor die, and wherein a portion of the chemically inert member that abuts the active surface of the semiconductor die is positioned between the o-ring seal and the electrochemical sensor in a horizontal plane.

4. The method of claim 1, further comprising positioning a photoresist on the electrochemical sensor.

5. The method of claim 1, further comprising aligning the chemically inert member with the substrate using an alignment rod extending through at least a portion of the chemically inert member and at least a portion of the substrate.

6. A method, comprising:
   providing a substrate including a first orifice;
   coupling an active surface of a semiconductor die to the substrate, the active surface facing the substrate and including an electrochemical sensor;
   aligning an o-ring seal with respect to the electrochemical sensor using a wall of the first orifice;
   based on the alignment, positioning an o-ring seal on the active surface via the first orifice of the substrate;
   compressing the o-ring seal using a chemically inert member; and
   positioning a mold compound inside a second orifice in the substrate and inside a third orifice in the chemically inert member, the second and third orifices in fluid communication with each other.

7. The method of claim 6, further comprising positioning a second member through the o-ring seal prior to compressing the o-ring seal with the chemically inert member.

8. The method of claim 7, further comprising removing the second member from the o-ring seal after compressing the o-ring seal with the chemically inert member.

9. The method of claim 6, wherein the chemically inert member comprises a fluid inlet extending from a fluid inlet port in a first surface of the chemically inert member, through a body of the chemically inert member, and to a second surface of the chemically inert member abutting the compressed o-ring seal.

10. A method, comprising:
    providing a substrate including an orifice;
    coupling a device side of a semiconductor die to the substrate such that the device side is in physical contact with the substrate via a conductive terminal, the device side including an electrochemical sensor; and
    positioning an o-ring seal between the substrate and the device side such that the o-ring seal circumscribes the electrochemical sensor and such that the o-ring seal is compressed.

11. The method of claim 10, wherein the substrate comprises a printed circuit board (PCB) and the o-ring seal comprises ethylene propylene diene monomer (EPDM).

12. The method of claim 10, wherein the o-ring seal abuts the substrate and the device side.

13. The method of claim 10, wherein the substrate comprises a notch, and wherein the o-ring seal occupies the notch.

14. The method of claim 10, wherein positioning the o-ring seal between the substrate and the device side comprises compressing the o-ring seal such that a thickness of the o-ring seal is no more than 75 percent of the thickness of the o-ring seal in an uncompressed state.

* * * * *